US012666174B2

(12) United States Patent
Moeys

(10) Patent No.: US 12,666,174 B2
(45) Date of Patent: Jun. 23, 2026

(54) PIXEL CIRCUIT AND SOLID-STATE IMAGING DEVICE

(71) Applicant: Sony Semiconductor Solutions Corporation, Atsugi (JP)

(72) Inventor: Diederik Paul Moeys, Stuttgart (DE)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 359 days.

(21) Appl. No.: 18/039,294

(22) PCT Filed: Dec. 9, 2021

(86) PCT No.: PCT/EP2021/085013
§ 371 (c)(1),
(2) Date: May 30, 2023

(87) PCT Pub. No.: WO2022/122929
PCT Pub. Date: Jun. 16, 2022

(65) Prior Publication Data
US 2024/0007769 A1      Jan. 4, 2024

(30) Foreign Application Priority Data

Dec. 11, 2020    (EP) .................................... 20213621

(51) Int. Cl.
*H04N 25/772* (2023.01)
*H03M 1/38* (2006.01)
*H04N 25/47* (2023.01)

(52) U.S. Cl.
CPC ............ *H04N 25/772* (2023.01); *H03M 1/38* (2013.01); *H04N 25/47* (2023.01)

(58) Field of Classification Search
None
See application file for complete search history.

(56) References Cited

U.S. PATENT DOCUMENTS 5,886,562 A     3/1999  Garrity et al.
8,149,310 B2    4/2012  Yin
(Continued)

FOREIGN PATENT DOCUMENTS

CN        107071314 A      8/2017
GB          2577353 A      3/2020
(Continued)

OTHER PUBLICATIONS

International Search Report and Written Opinion mailed on Mar. 15, 2022, received for PCT Application PCT/ EP2021/085013, filed on Dec. 9, 2021, 15 pages.
(Continued)

*Primary Examiner* — Mark T Monk
(74) *Attorney, Agent, or Firm* — XSENSUS LLP

(57) ABSTRACT

A pixel circuit (300) includes a photoreceptor circuit block (PR) configured to generate a photoreceptor signal. An analog-to-digital converter stage (500) is configured to compare a first input photoreceptor signal with at least one first threshold voltage and to compare a second input photoreceptor signal with at least one second threshold voltage. An electronic switch assembly (310) is configured to pass the photoreceptor signal to the first comparison in a first operating state and to pass the photoreceptor signal to the second comparison in a second operating state.

13 Claims, 22 Drawing Sheets

(56) References Cited

U.S. PATENT DOCUMENTS

| | | | |
|---|---|---|---|
| 9,503,114 | B1 | 11/2016 | Ali et al. |
| 10,567,679 | B2 | 2/2020 | Berner et al. |
| 2007/0091175 | A1 | 4/2007 | Iddan et al. |
| 2007/0146181 | A1 | 6/2007 | Chen et al. |
| 2010/0153041 | A1 | 6/2010 | Doris |
| 2011/0253717 | A1 | 10/2011 | Luburic et al. |
| 2011/0254717 | A1 | 10/2011 | Van De Vel et al. |
| 2014/0285333 | A1* | 9/2014 | Imamura .............. B60L 3/0007 340/436 |
| 2016/0093273 | A1 | 3/2016 | Wang et al. |
| 2016/0309100 | A1* | 10/2016 | Abe ........................ H10F 39/18 |
| 2018/0098003 | A1 | 4/2018 | Matolin et al. |
| 2020/0358977 | A1 | 11/2020 | Niwa et al. |

FOREIGN PATENT DOCUMENTS

| | | | |
|---|---|---|---|
| JP | H01-134619 | A | 5/1989 |
| JP | H05-161068 | A | 6/1993 |

OTHER PUBLICATIONS

Culurciello et al., "CMOS image sensors for sensor networks", Analog Integrated Circuits and Signal Processing, vol. 49, No. 1, Jun. 27, 2006, pp. 39-51.

Landolt et al., "Visual sensor with resolution enhancement by mechanical vibrations", Conference on Advanced Research in ARVLSI, 2001, pp. 249-264.

* cited by examiner

Figure 18:
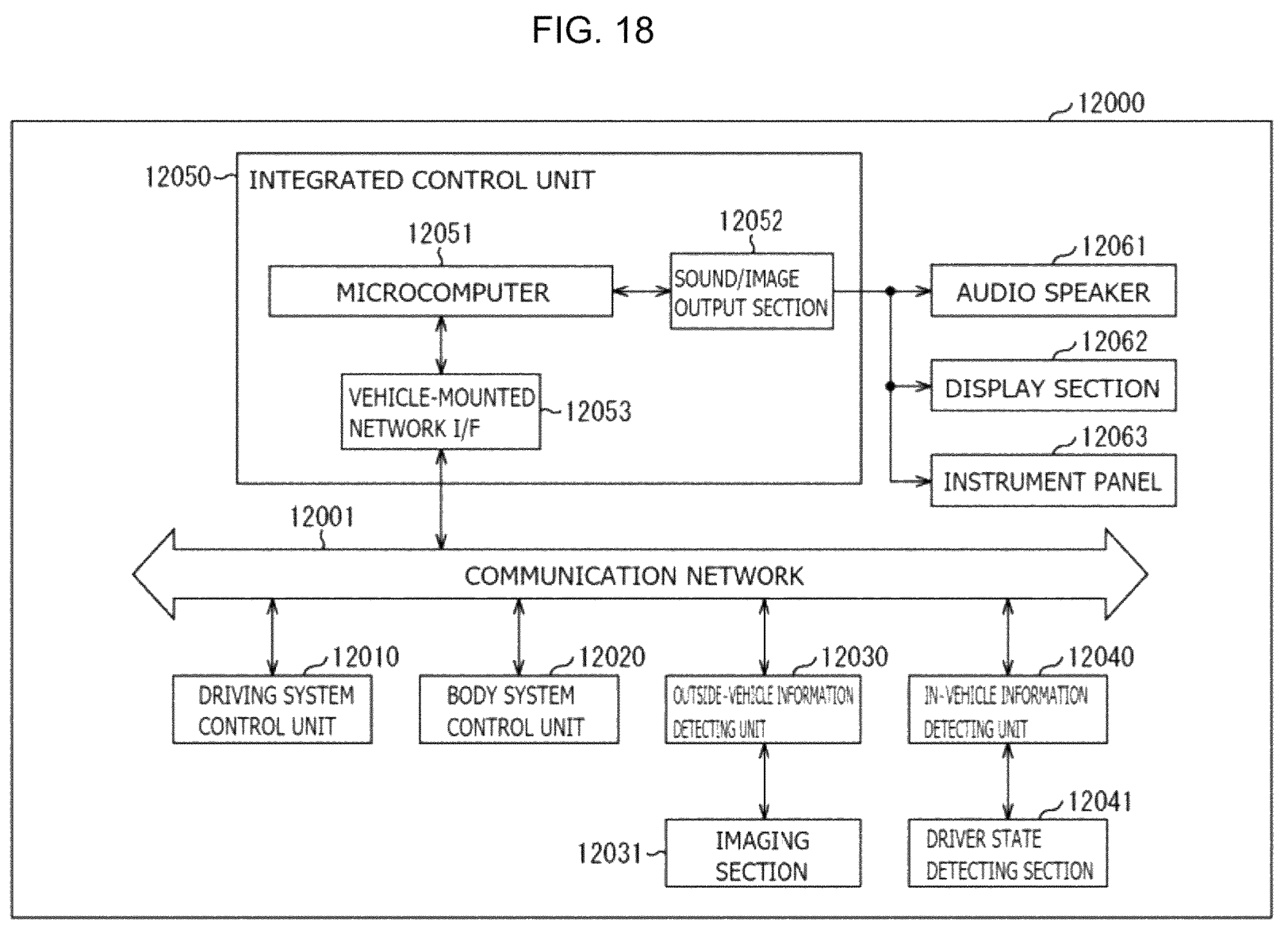

INTEGRATED CONTROL UNIT — 12050

MICROCOMPUTER — 12051

SOUND/IMAGE OUTPUT SECTION — 12052

VEHICLE-MOUNTED NETWORK I/F — 12053

AUDIO SPEAKER — 12061

DISPLAY SECTION — 12062

INSTRUMENT PANEL — 12063

COMMUNICATION NETWORK — 12001

DRIVING SYSTEM CONTROL UNIT — 12010

BODY SYSTEM CONTROL UNIT — 12020

OUTSIDE-VEHICLE INFORMATION DETECTING UNIT — 12030

IMAGING SECTION — 12031

IN-VEHICLE INFORMATION DETECTING UNIT — 12040

DRIVER STATE DETECTING SECTION — 12041

PIXEL CIRCUIT AND SOLID-STATE IMAGING DEVICE

CROSS-REFERENCE TO RELATED APPLICATIONS

The present application is based on PCT filing PCT/EP2021/085013, filed Dec. 9, 2021, and claims priority to EP Application Serial No. 20213621.4, filed Dec. 11, 2020, the entire contents of each are incorporated herein by reference.

FIELD OF THE INVENTION

The present disclosure relates to a pixel circuit and a solid-state imaging device. In particular, the present disclosure is related to the field of event detection sensors reacting to changes in light intensity, such as dynamic vision sensors (DVS).

BACKGROUND

Computer vision deals with how machines and computers can gain high-level understanding from digital images or videos. Typically, computer vision methods aim at excerpting, from raw image data obtained through an image sensor, that type of information the machine or computer uses for other tasks.

Many applications such as machine control, process monitoring or surveillance tasks are based on the evaluation of the movement of objects in the imaged scene. Conventional image sensors with a plurality of pixels arranged in an array of pixels deliver a sequence of still images (frames). Detecting moving objects in the sequence of frames typically involves elaborate and expensive image processing methods.

Event detection sensors like DVS tackle the problem of motion detection by delivering only information about the position of changes in the imaged scene. Unlike image sensors that transfer large amounts of image information in frames, transfer of information about pixels that do not change can be omitted, resulting in a sort of in-pixel data compression. The in-pixel data compression removes data redundancy and facilitates high temporal resolution, low latency, low power consumption, and high dynamic range with little motion blur. DVS are thus well suited especially for solar or battery powered compressive sensing or for mobile machine vision applications where the motion of the system including the image sensor has to be estimated and where processing power is limited due to limited battery capacity. In principle the architecture of DVS allows for high dynamic range and good low-light performance, in particular in the field of computer vision.

It is desirable to further improve the inherently high temporal resolution of pixel circuits and solid-state imaging devices adapted for event detection like DVS.

SUMMARY OF INVENTION

Typically, a pixel of a solid-state imaging device implementing event detection includes a photoreceptor conversion block (photoreceptor module) and a pixel back-end. The photoreceptor conversion block includes at least one photoelectric conversion element per pixel and outputs a photoreceptor signal, wherein a voltage level of the photoreceptor signal depends on the intensity of light detected by the photoelectric conversion element. The pixel back-end processes the photoreceptor signal and generates event information each time a change in light intensity exceeds predefined threshold values. The event information includes information about the position of the pixel for which the light intensity exceeded the threshold. Parts of the pixel back-end may be shared between two more pixels. A controller may retrieve the event information from the various pixel circuits, e.g., at regular intervals or on demand.

The present disclosure mitigates shortcomings of conventional pixel circuits of solid-state imaging devices suitable for event detection.

To this purpose, a pixel circuit according to the present disclosure includes a photoreceptor circuit block that is configured to generate a photoreceptor signal, wherein a voltage level of the photoreceptor signal may depend on the intensity of light detected in a photoelectric conversion element. An analog-to-digital converter stage includes a first input and a second input. The analog-to-digital converter stage is configured to compare a signal based on a first input signal applied to the first input with at least one first threshold voltage and to compare a signal based on a second input signal applied to the second input with at least one second threshold voltage. An electronic switch assembly is configured to pass the photoreceptor signal to the first input in a first operating state and to the second input in a second operating state.

The electronic switch assembly facilitates sequentially passing the photoreceptor signal from one single photoreceptor circuit block to at least two inputs of an analog-to-digital converter stage. The analog-to-digital converter stage comparing the input signals on the at least two inputs with predefined thresholds enables processing separately two or more input signals derived from the same photoelectric conversion element. With the electronic switch assembly enabling sequentially passing the photoreceptor signal derived from a single photoelectric conversion device to the multiple inputs of the analog-to-digital converter stage it is possible to decouple to some degree the step of sampling light intensity in the pixel circuit and the step of reading out the event information from the pixel circuit.

In particular, passing the photoreceptor signal from a first one of the analog-to-digital converter stage inputs to a second one after detection of an event by processing the photoreceptor signal applied to the first one of the analog-to-digital converter stage inputs enables the detection of changes in light intensity even before the previous event detected by the pixel circuit has been retrieved from an output stage of the pixel circuit. Temporal resolution can be increased and the probability of information loss can be reduced.

3

Figure 3A:
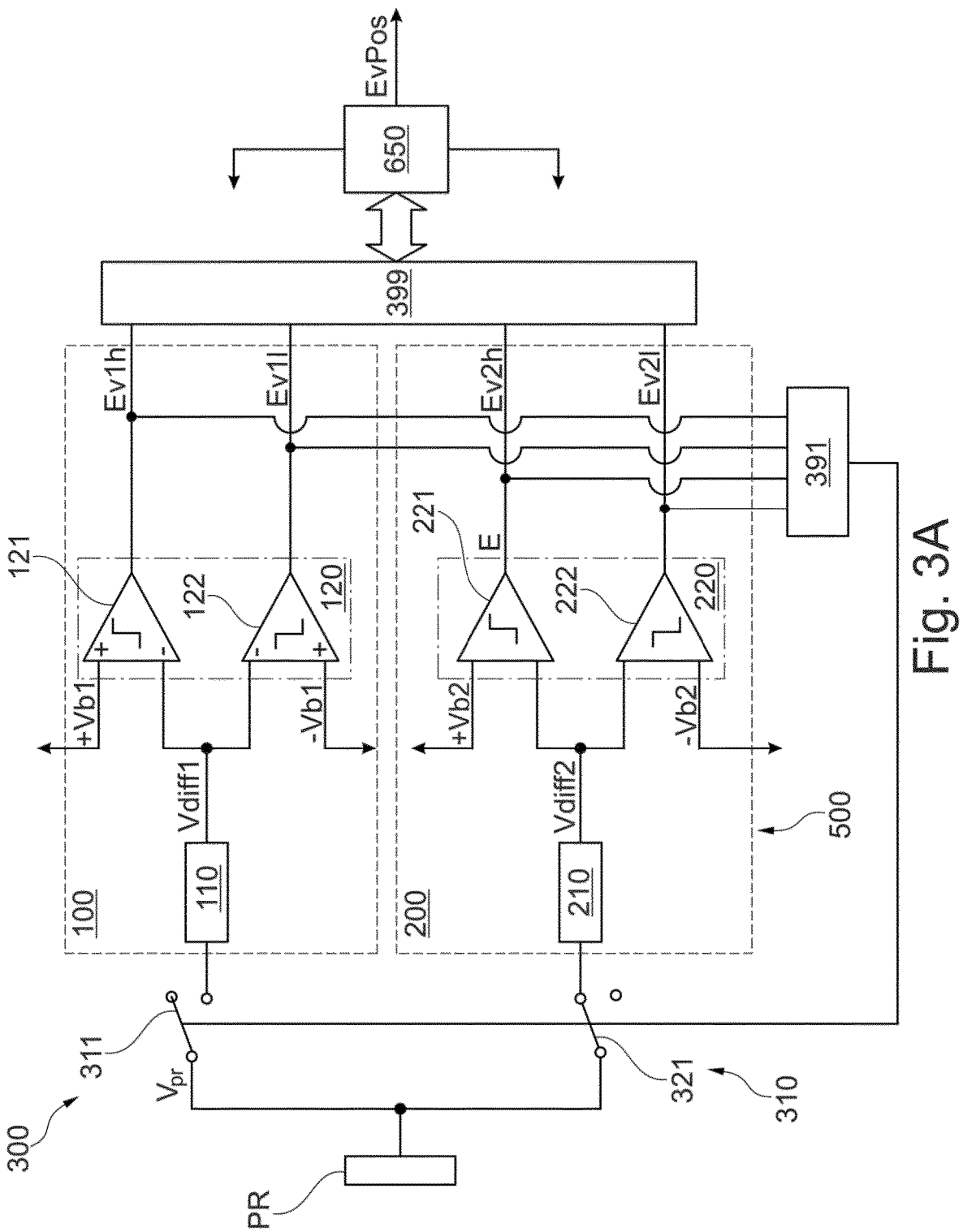
FIG. 3A is a simplified circuit diagram of a pixel circuit according to an embodiment concerning an analog-to-digital converter stage with one converter circuit for each input.
Figure 3B:
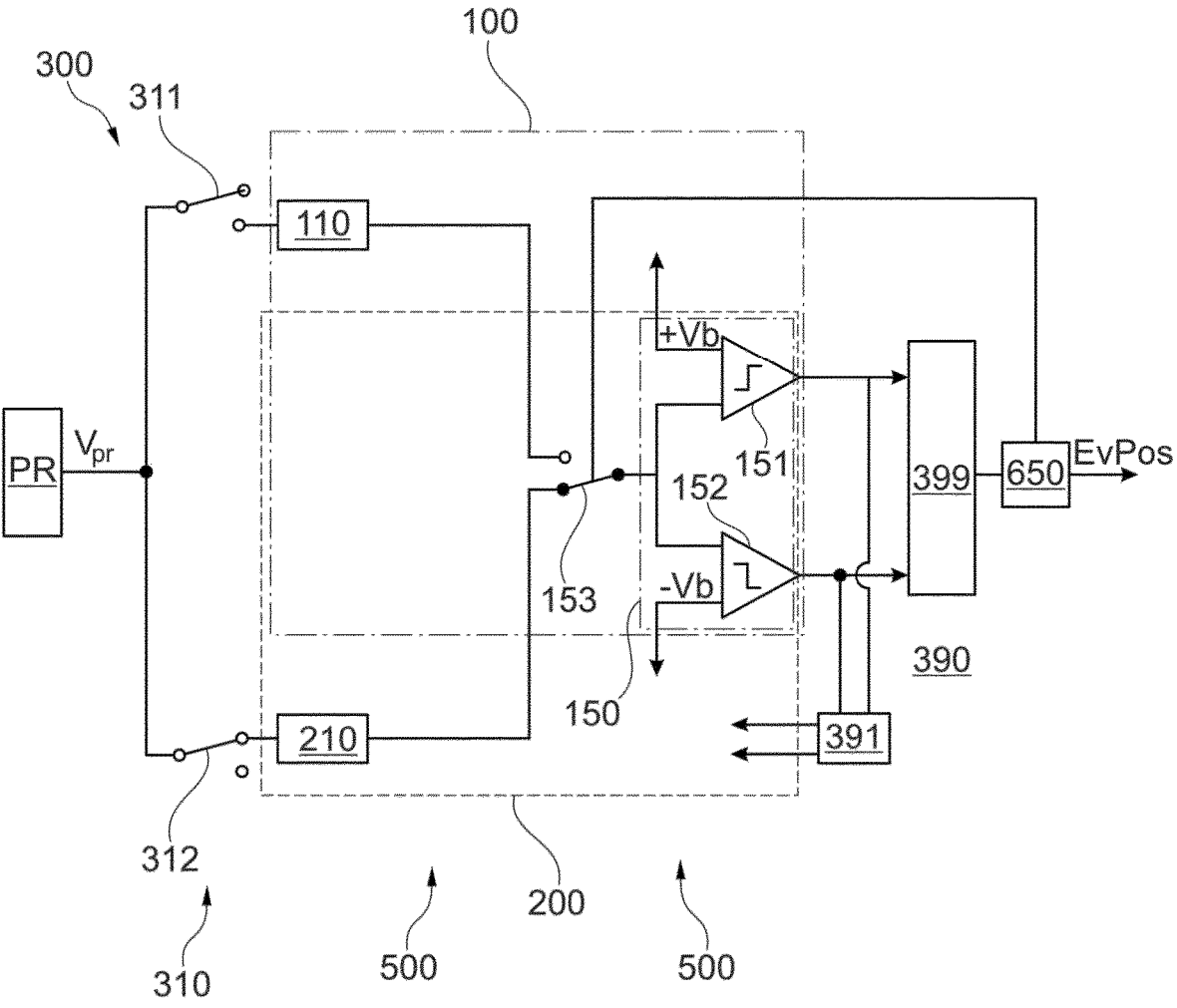

FIG. 3B is a simplified circuit diagram of a pixel circuit according to an embodiment concerning an analog-to-digital converter stage with inputs sharing a converter circuit.

Figure 4:
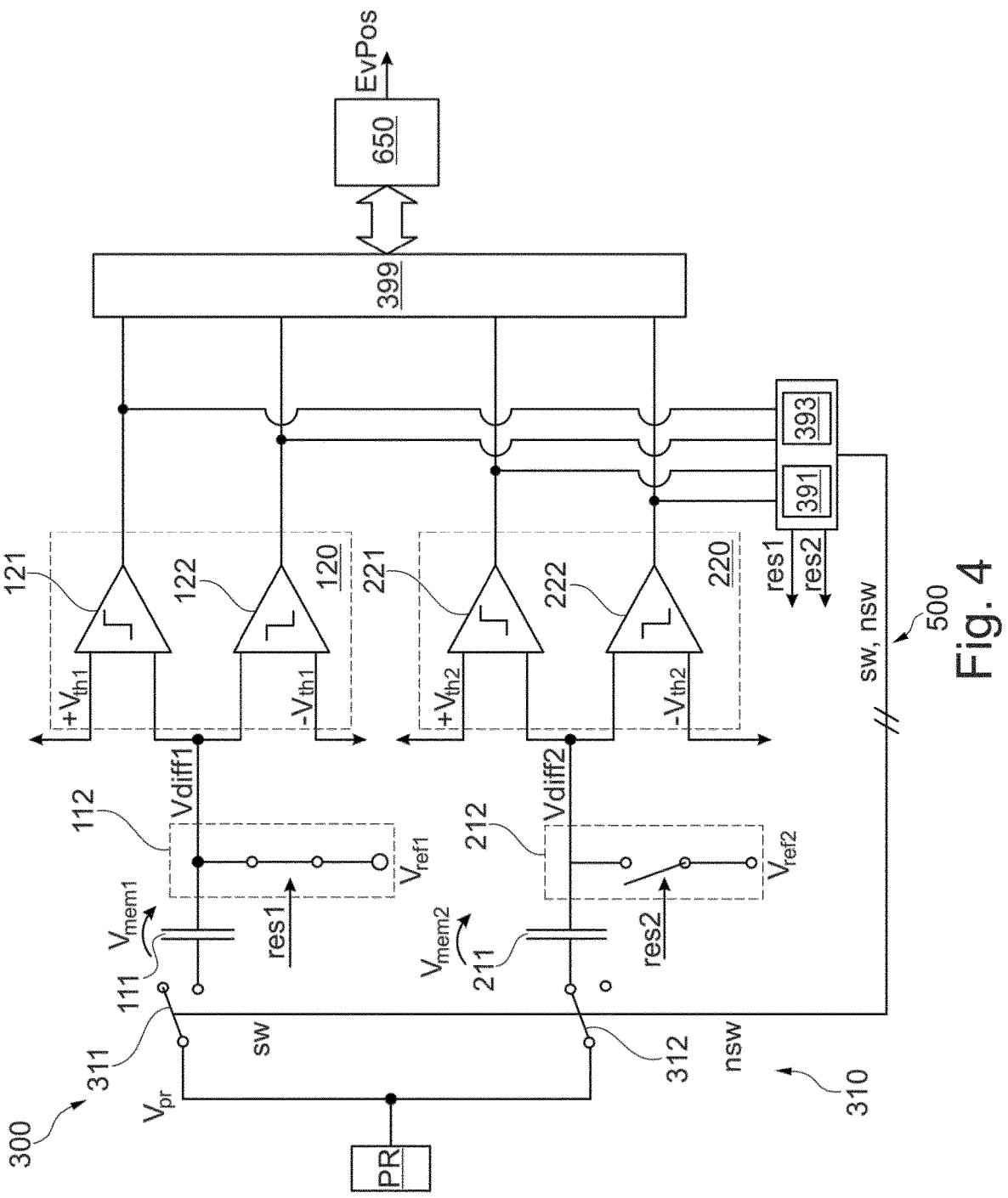

FIG. 4 is a simplified circuit diagram of a pixel circuit according to an embodiment concerning an analog-to-digital converter stage with voltage memory circuits.

Figure 5:
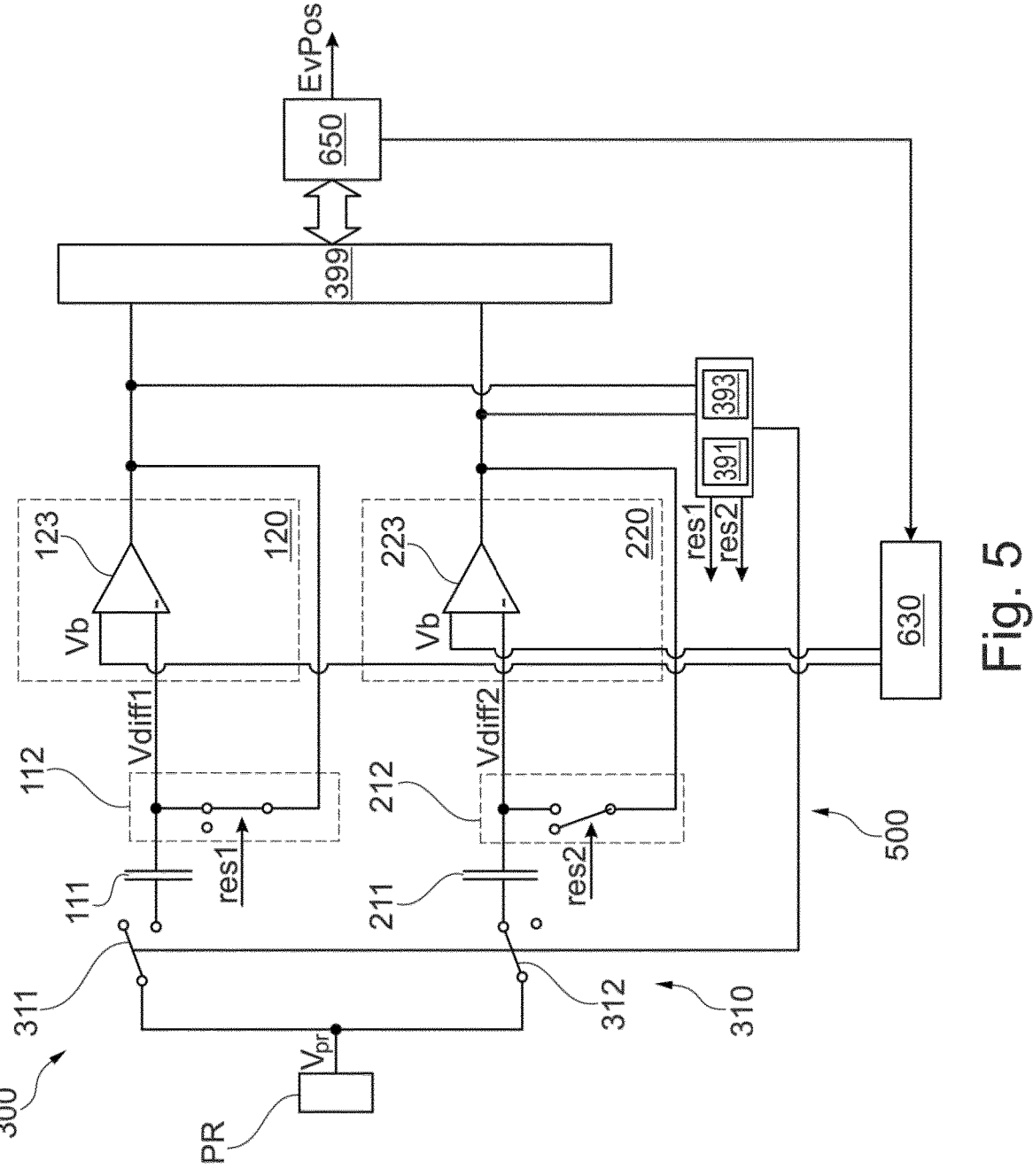

FIG. 5 is a simplified circuit diagram of a pixel circuit according to another embodiment concerning an analog-to-digital converter stage with voltage memory circuits and voltage memory reset circuits.

Figure 6:
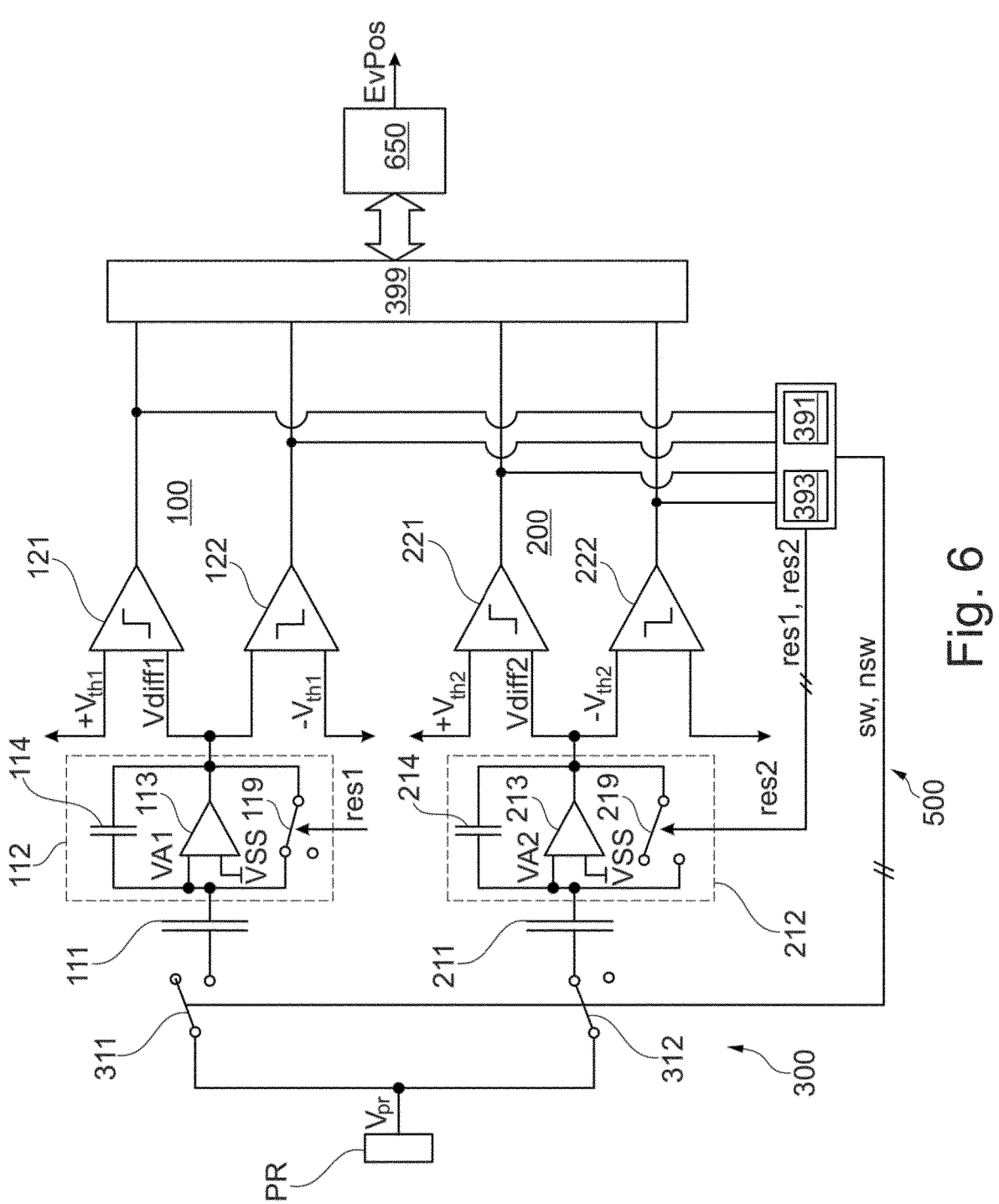

FIG. 6 is a simplified circuit diagram of a pixel circuit according to an embodiment concerning an analog-to-digital converter stage with voltage amplifiers in the input paths.

Figure 7A:
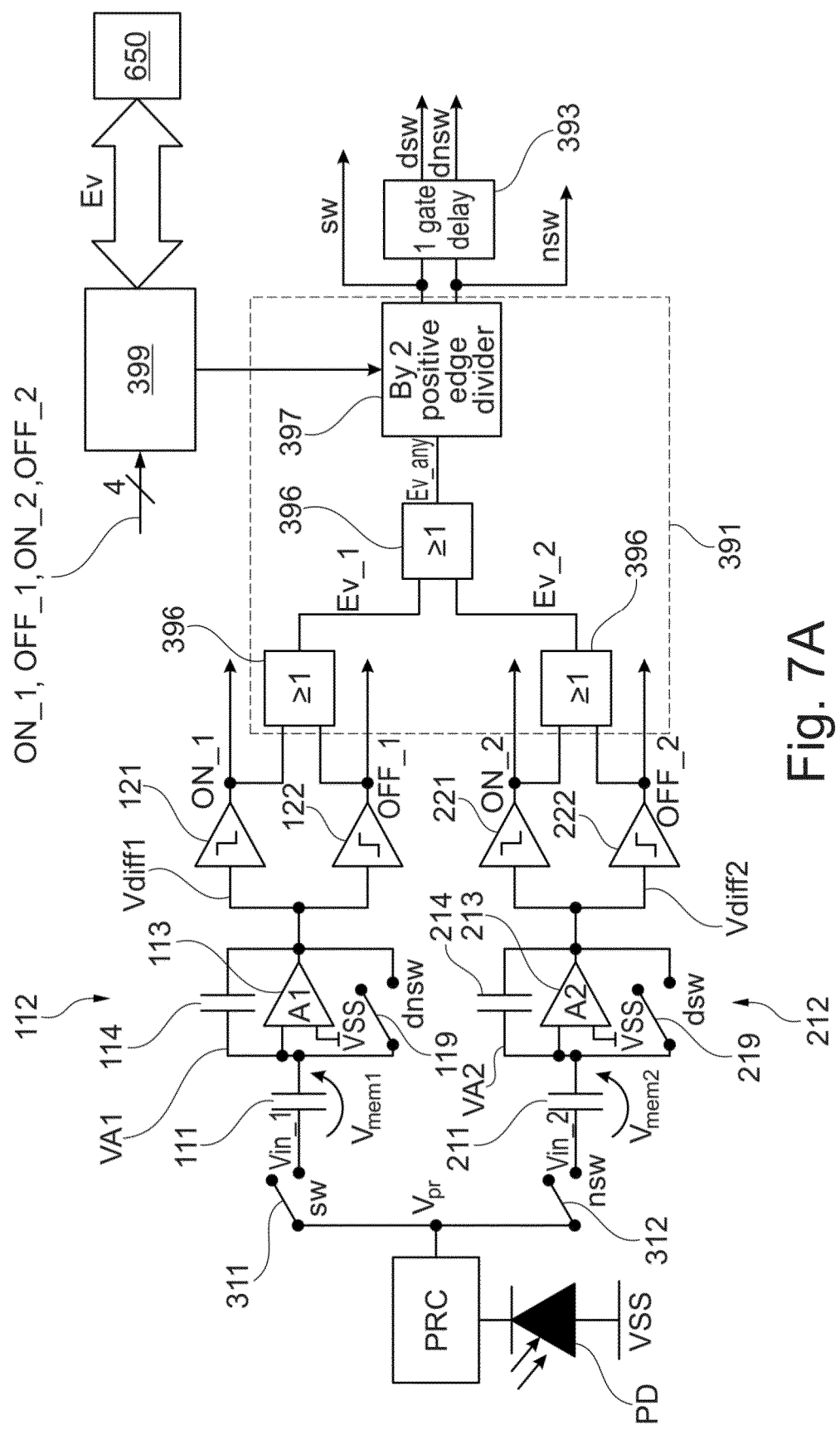

FIG. 7A is a simplified circuit diagram of a pixel circuit according to an embodiment concerning an analog-to-digital converter stage with voltage amplifiers in the input paths and with control circuits.

Figure 7B:
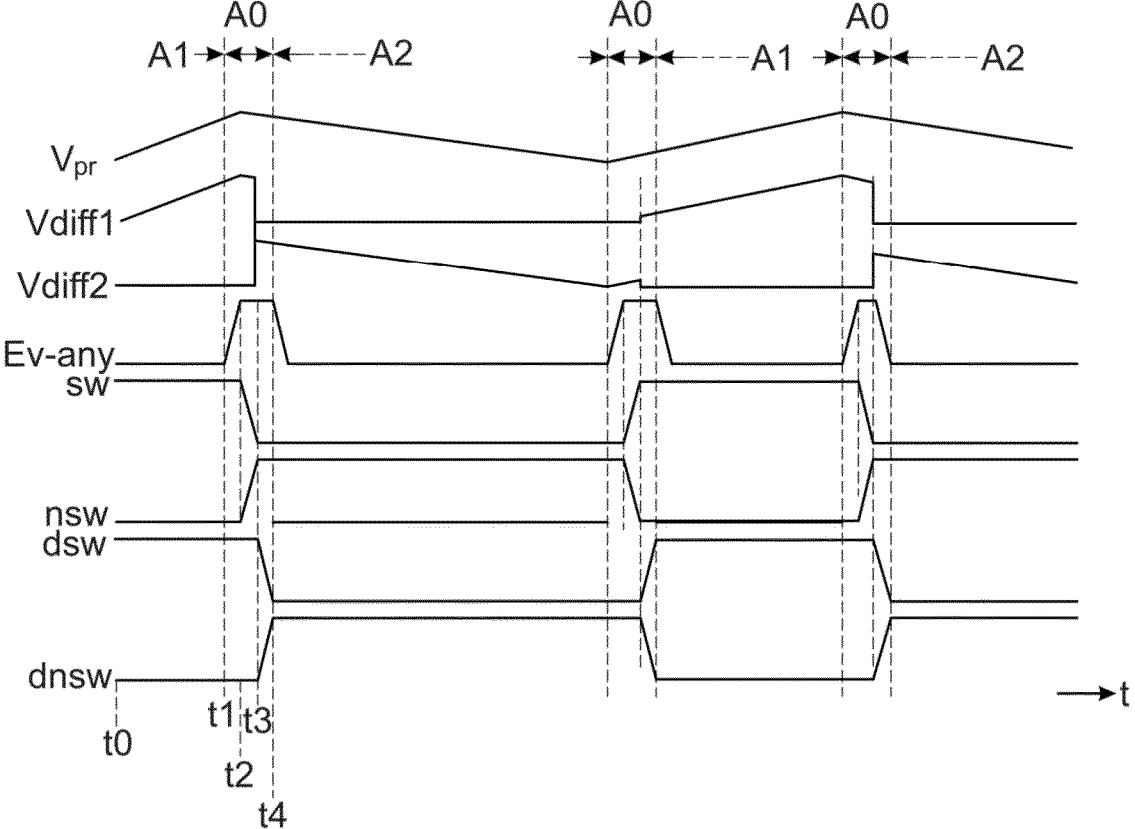

FIG. 7B is a simplified time-chart of control signals output by the control circuits of FIG. 7A.

Figure 8:
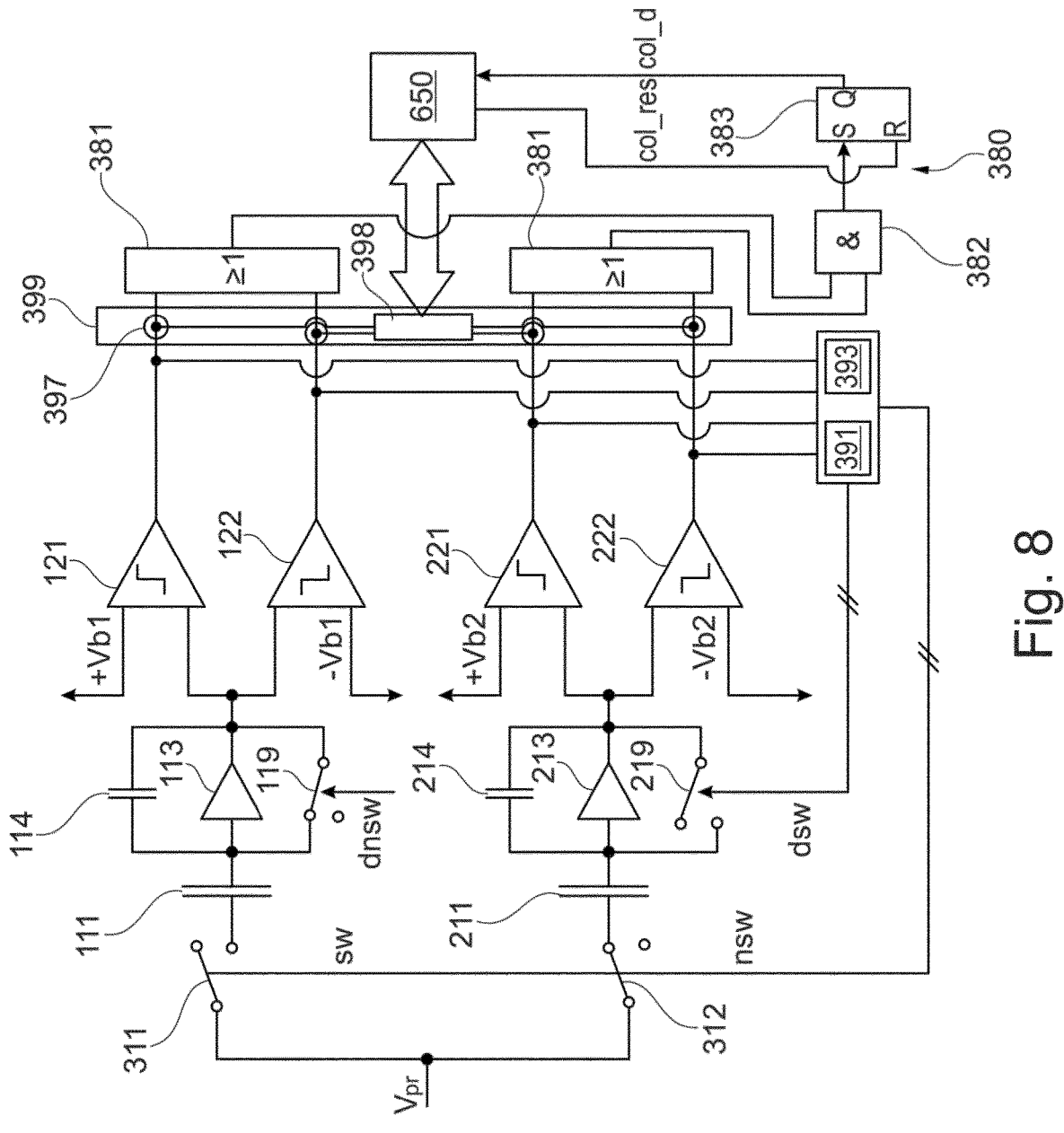

FIG. 8 is a simplified circuit diagram of a pixel circuit according to an embodiment concerning an analog-to-digital converter stage with collision detection circuit.

Figure 9:
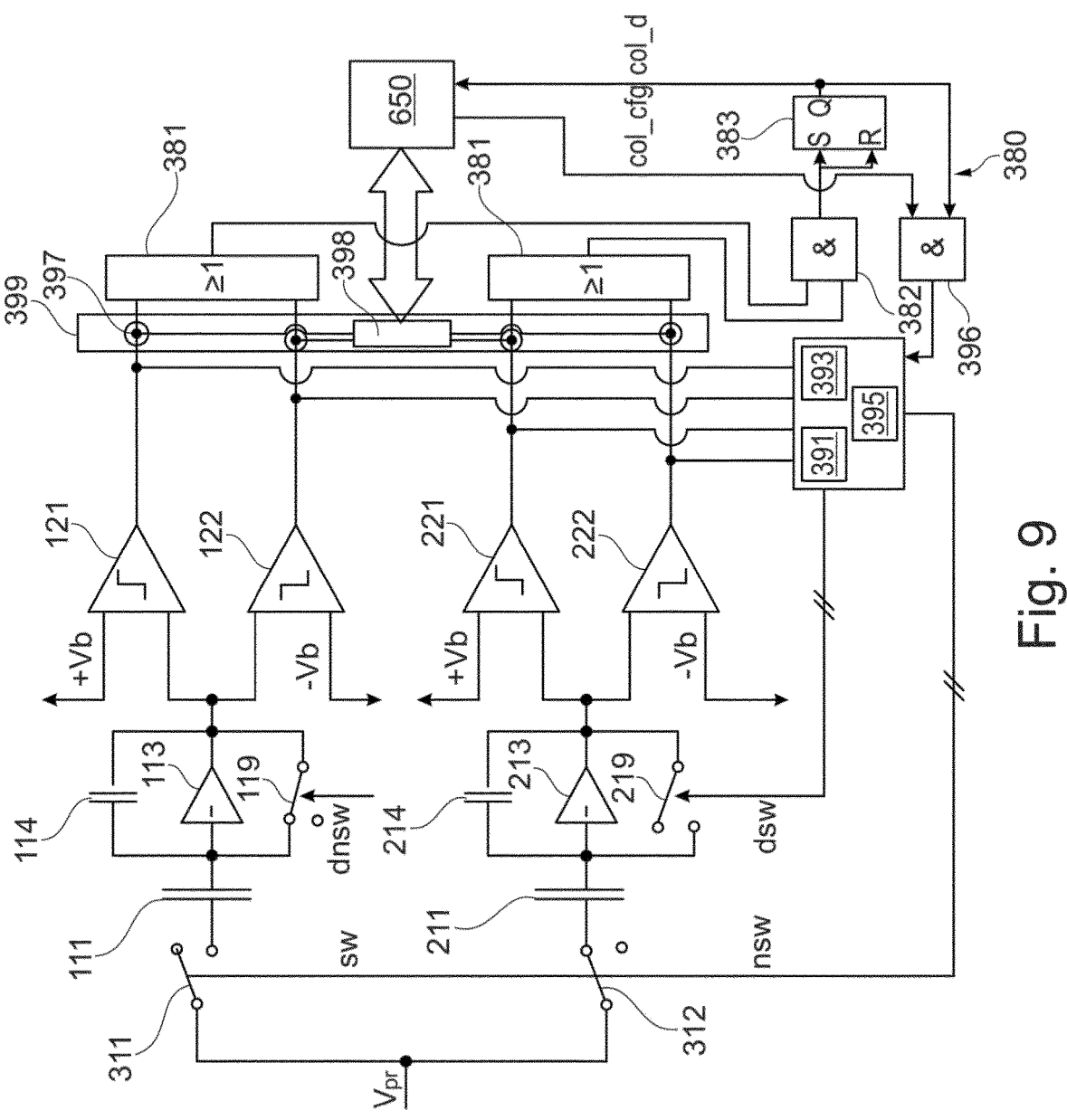

FIG. 9 is a simplified circuit diagram of a pixel circuit according to an embodiment concerning an analog-to-digital converter stage with collision control circuit.

Figure 10:
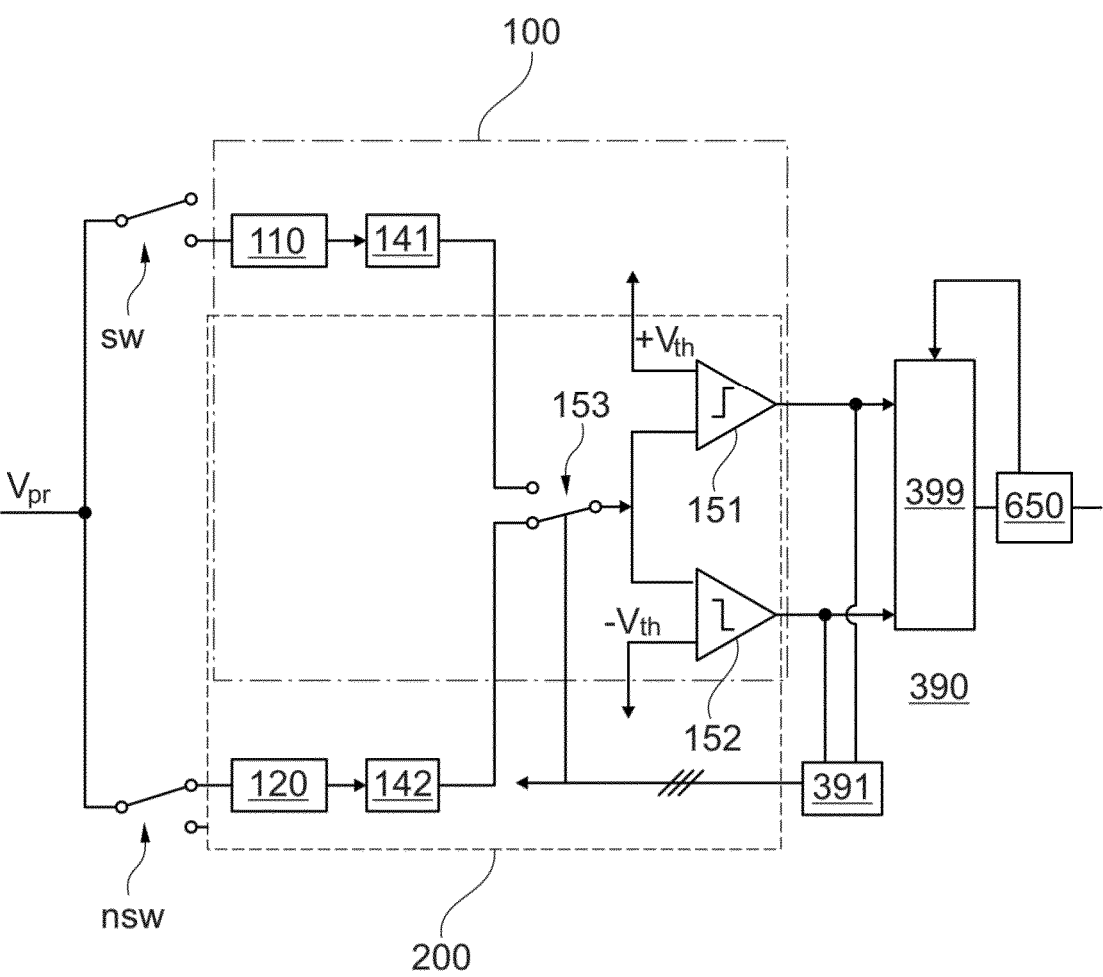

FIG. 10 is a simplified circuit diagram of a pixel circuit according to an embodiment concerning an analog-to-digital converter stage with inputs sharing a converter circuit and with separated voltage memory circuits.

Figure 11:
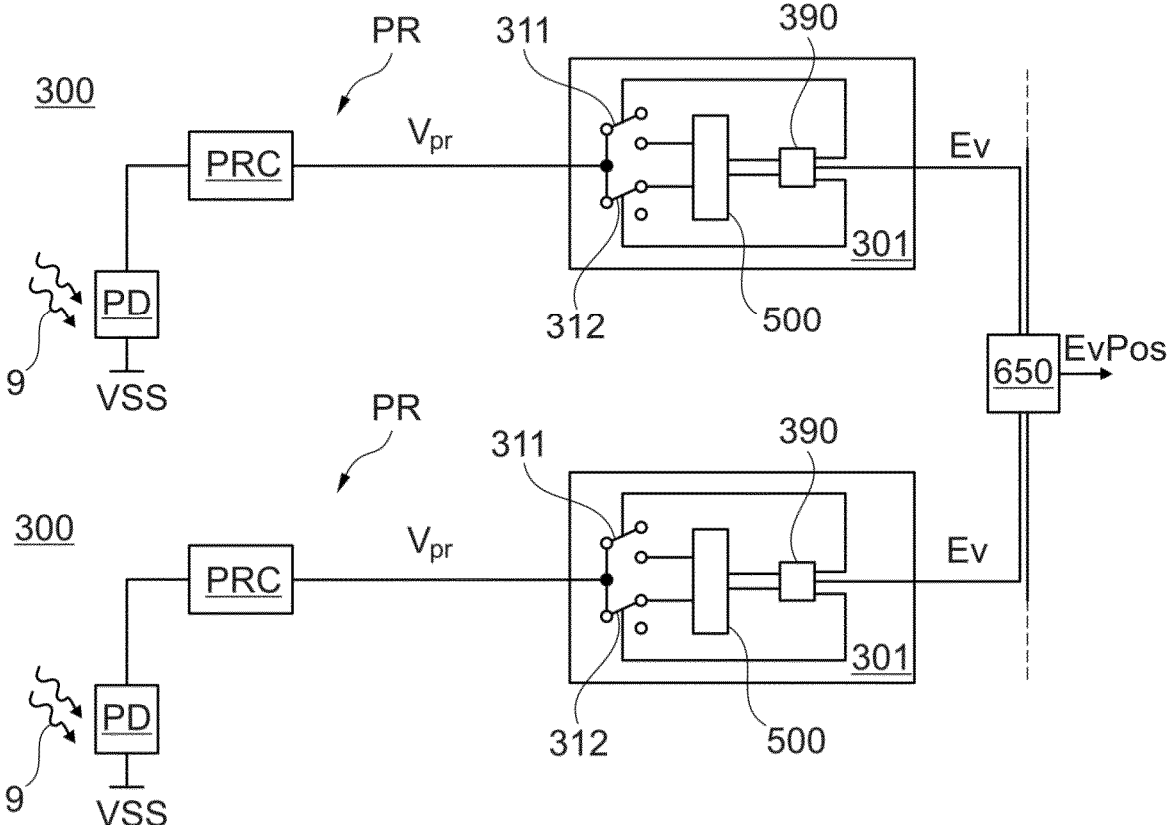

FIG. 11 is a schematic circuit diagram of a pixel circuit according to another embodiment.

Figure 12:
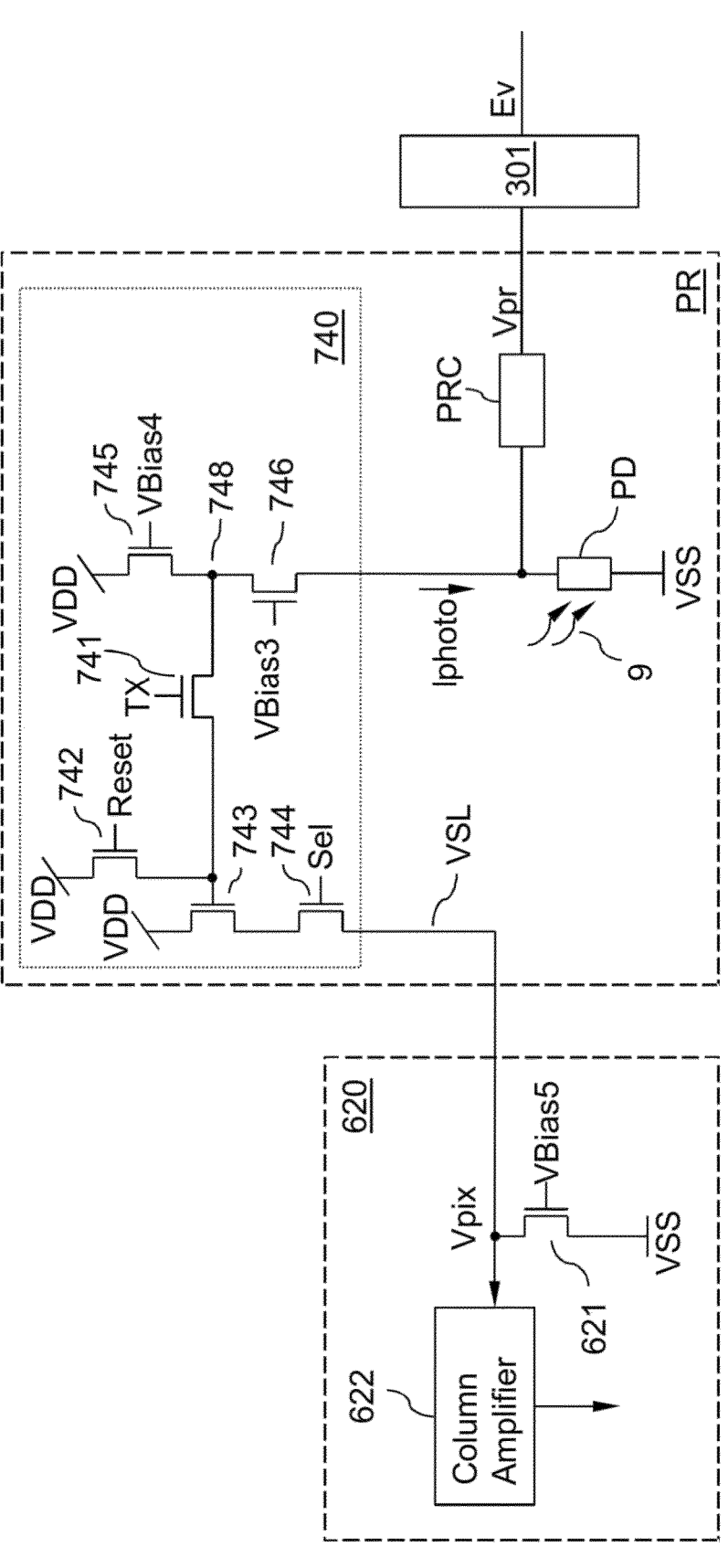

FIG. 12 is a simplified circuit diagram of a pixel circuit including an intensity readout circuit according to an embodiment with simultaneous intensity readout and event detection.

Figure 13:
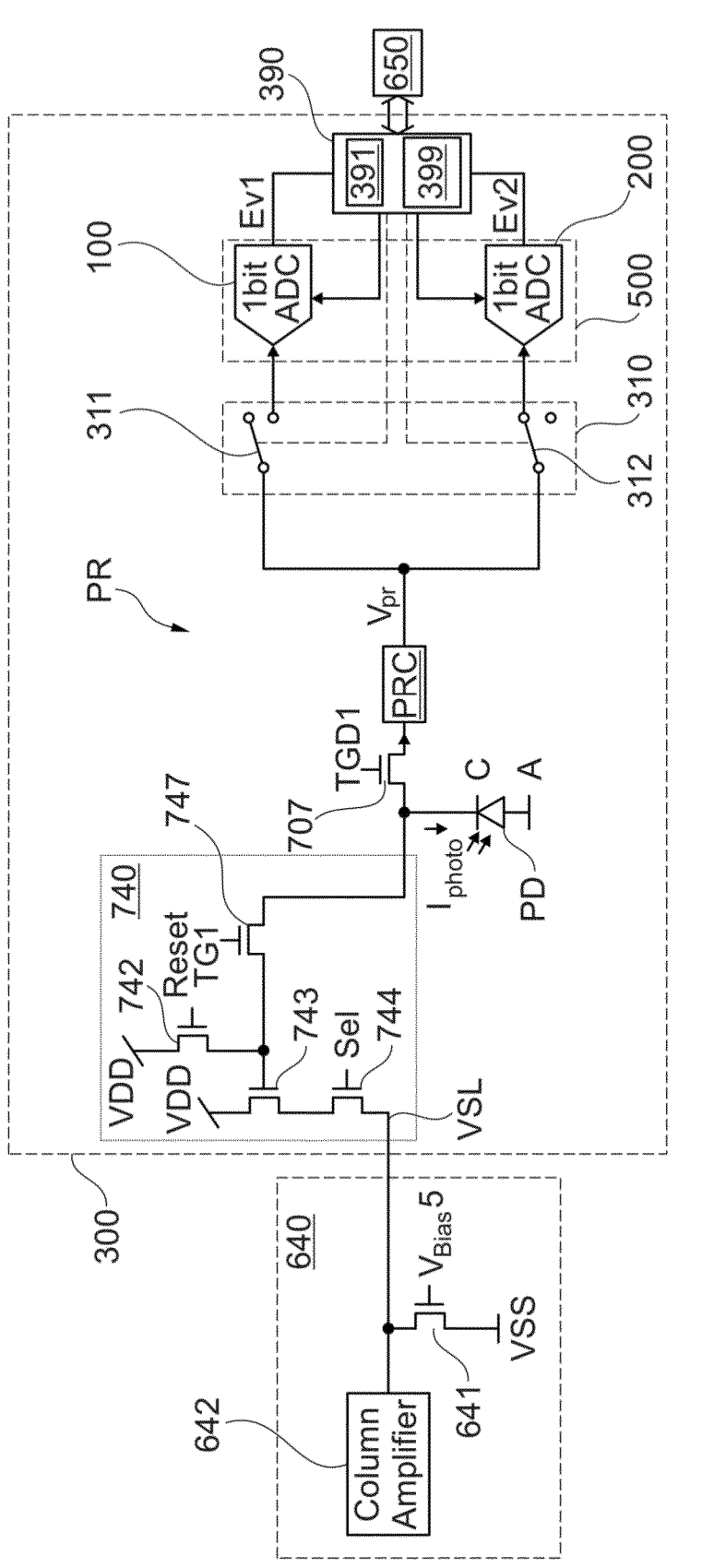

FIG. 13 is a simplified circuit diagram of a pixel circuit including an intensity readout circuit according to an embodiment with sequential intensity readout and event detection.

Figure 14:
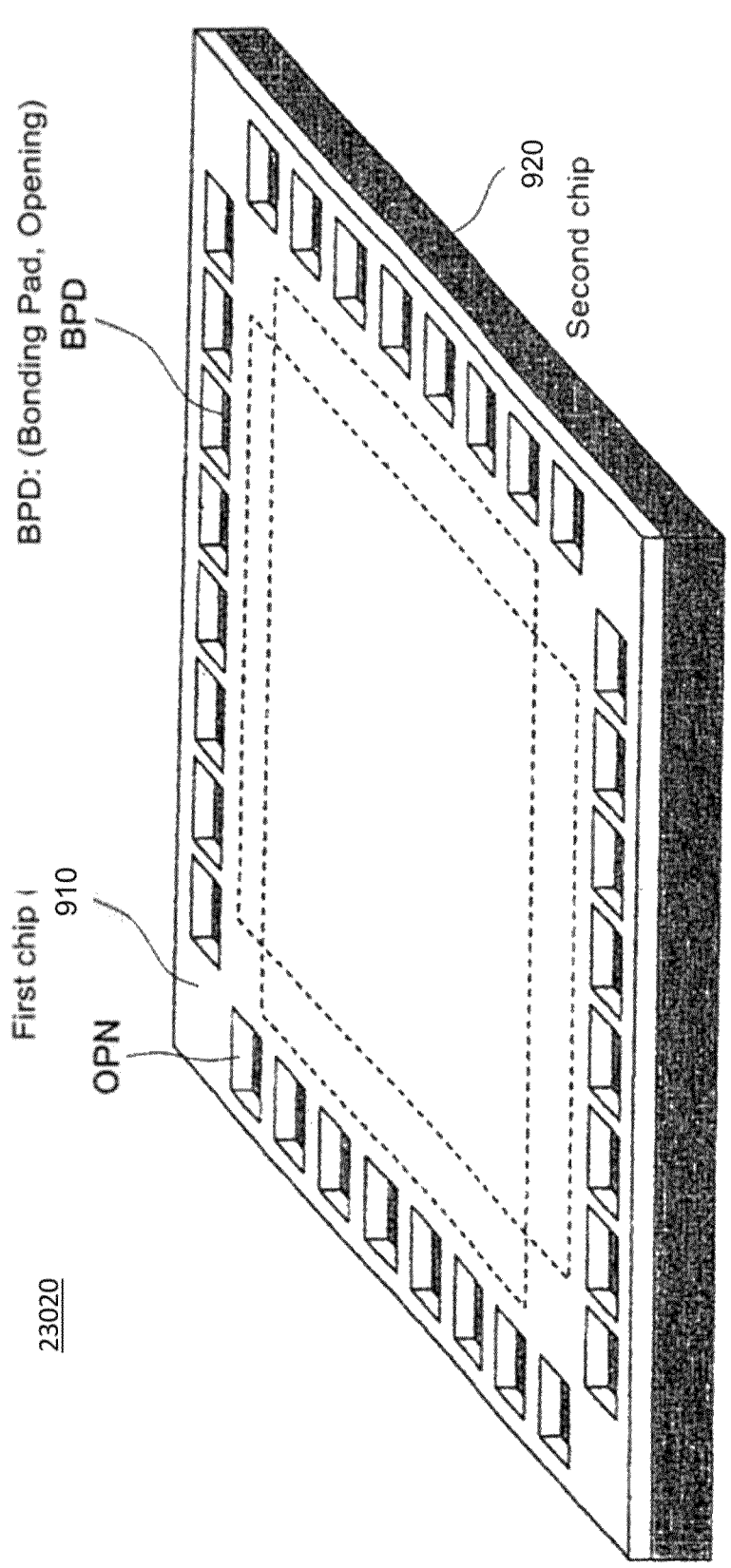

FIG. 14 is a simplified perspective view of a solid-state imaging device with laminated structure according to an embodiment of the present disclosure.

Figure 15:
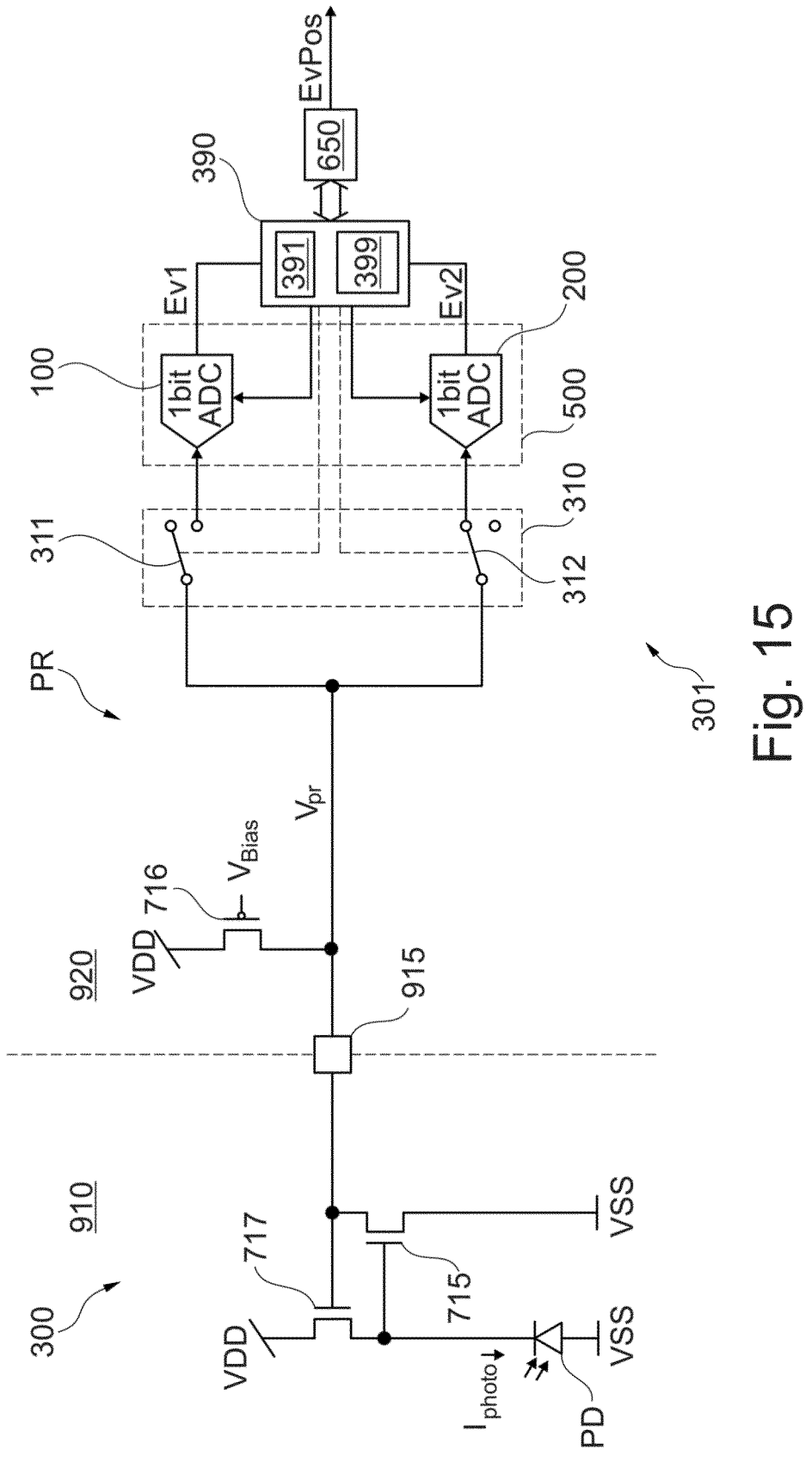

FIG. 15 is a schematic circuit diagram of a pixel circuit with a photoelectric conversion element and with elements of a photoreceptor circuit formed on a first chip of a solid-state imaging device with laminated structure according to an embodiment.

Figure 16:
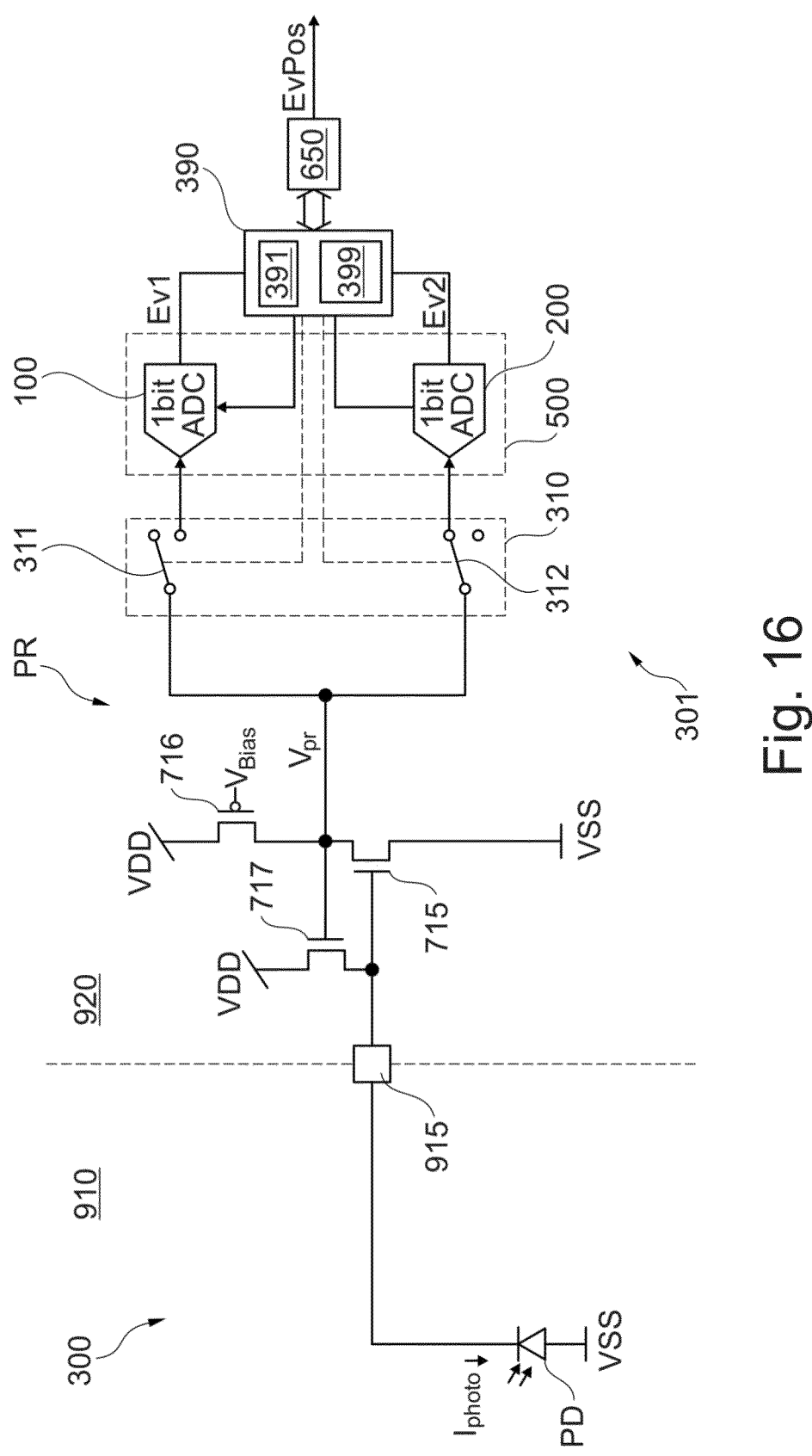

FIG. 16 is a schematic circuit diagram of a pixel circuit with the photoreceptor circuit mainly formed on a second chip of a solid-state imaging device with laminated structure according to an embodiment.

Figure 17:
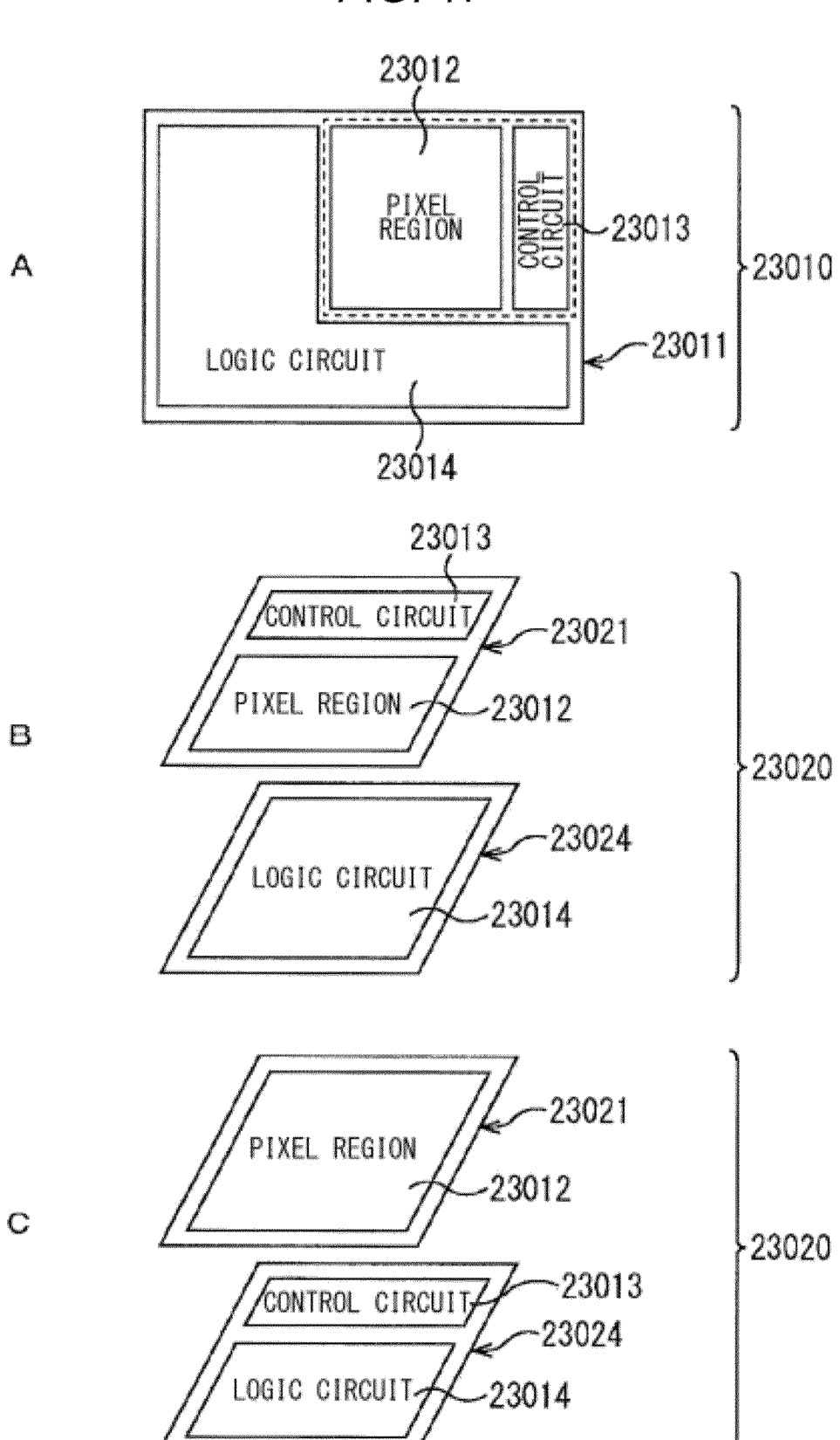

FIG. 17 illustrates simplified diagrams of configuration examples of a multi-layer solid-state imaging device to which a technology according to the present disclosure may be applied.

FIG. 18 is a block diagram depicting an example of a schematic configuration of a vehicle control system.

Figure 19:
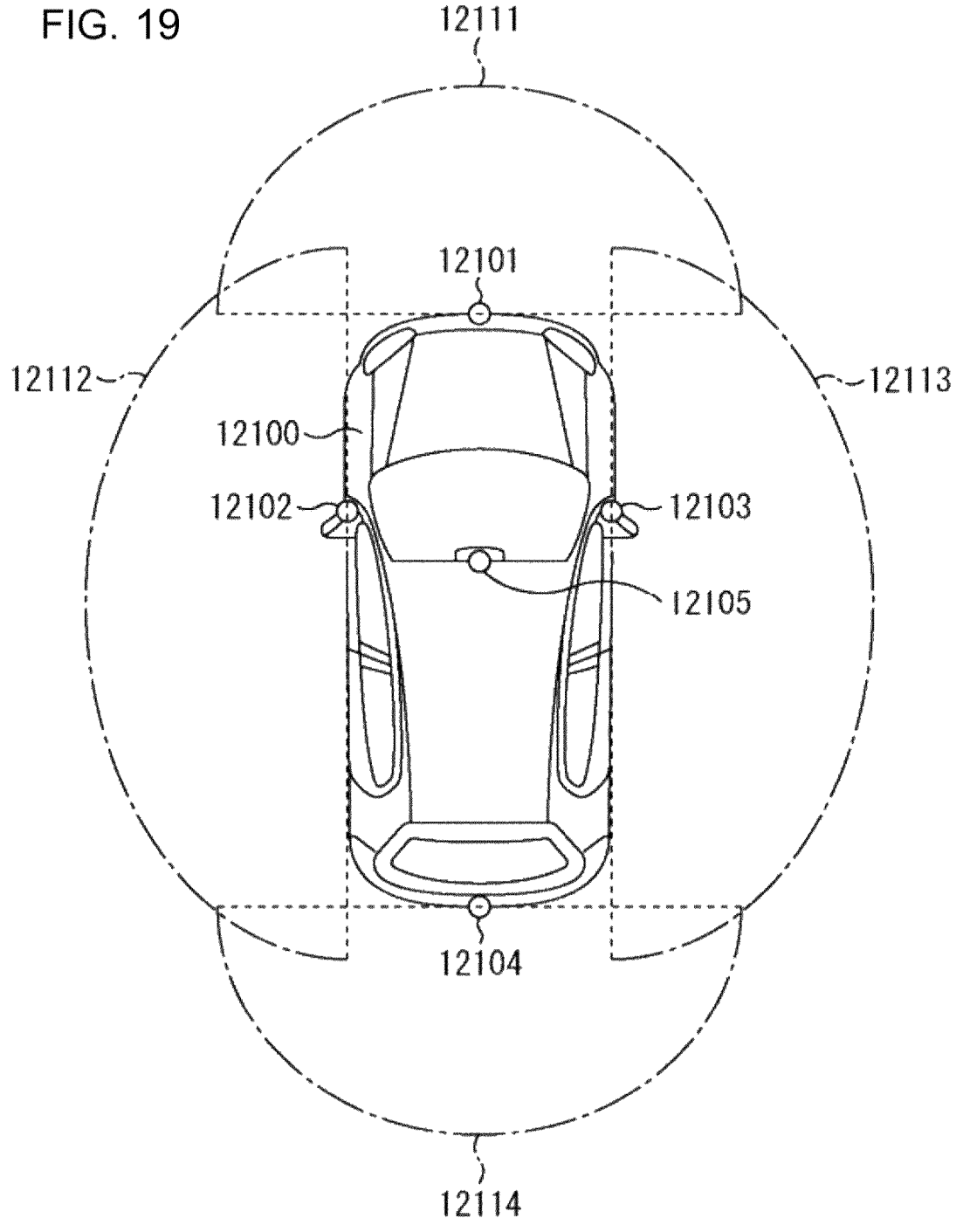

FIG. 19 is a diagram of assistance in explaining an example of installation positions of an outside-vehicle information detecting section and an imaging section of the vehicle control system of FIG. 18.

DETAILED DESCRIPTION

Figure 1A:
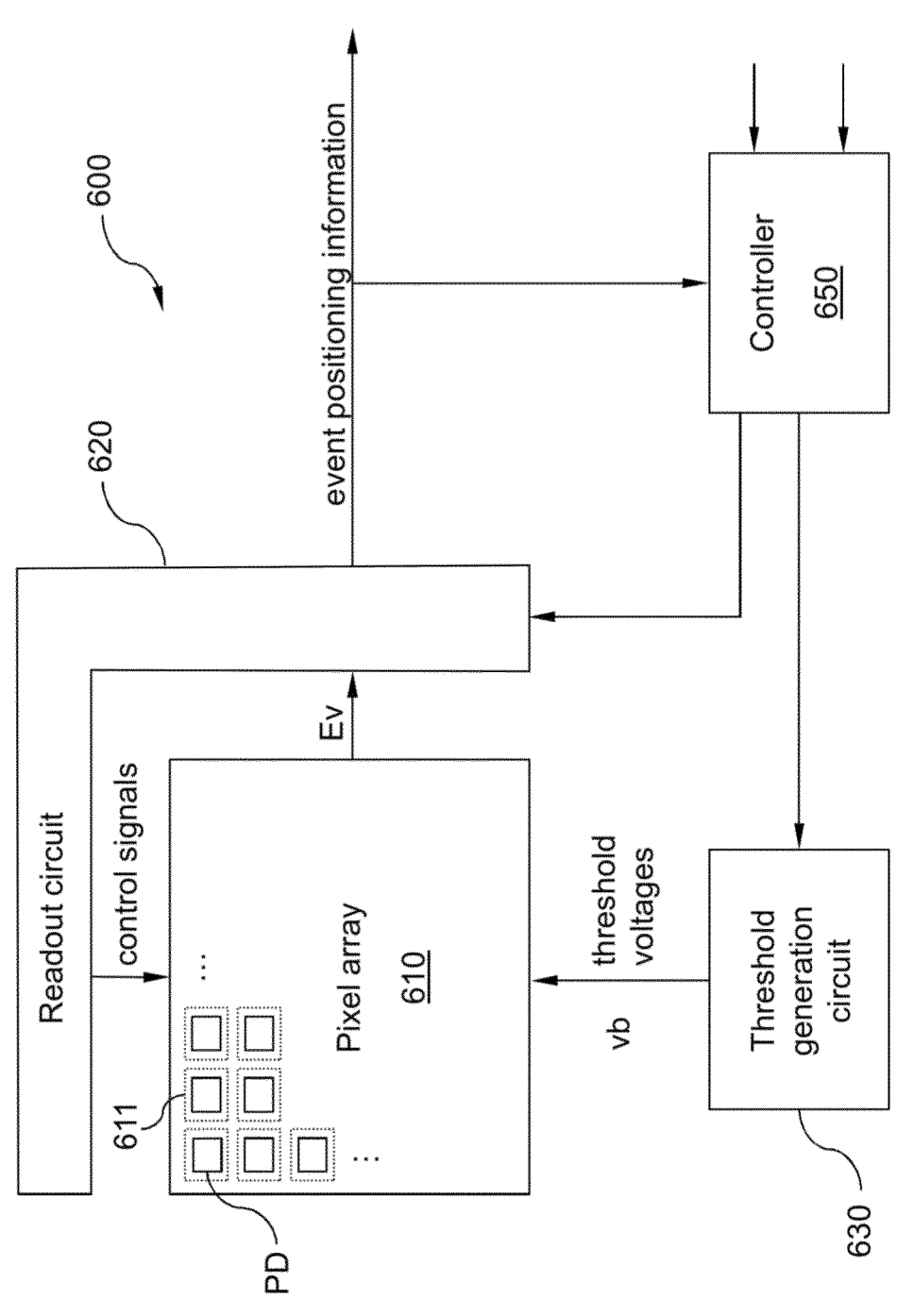
FIG. 1A is a simplified block diagram of a solid-state imaging device including a pixel array with pixel circuits for event detection according to the present disclosure.

FIG. 1A is a block diagram of a solid-state imaging device 600 employing event-based change detection. The solid-state imaging device 600 includes a pixel array 610 with one or more pixels 611, wherein each pixel 611 includes a photoelectric conversion element PD. The pixel array 610 may include one single photoelectric conversion element PD or may be a one-dimensional pixel array with the photoelectric conversion elements PD of all pixels arranged along a straight or meandering line (line sensor). In particular, the pixel array 610 may be a two-dimensional array, wherein the photoelectric conversion elements PDs of the pixels 611 may be arranged along straight or meandering rows and along straight or meandering lines.

The illustrated embodiment shows a two dimensional array of pixels 611, wherein the pixels 611 are arranged along straight rows and along straight columns running orthogonal to the rows. Each pixel 611 converts incoming light into digital, e.g. binary event data Ev indicating a change of the light intensity, e.g. an increase by at least an upper threshold amount and/or a decrease by at least a lower threshold amount. Each pixel 611 may temporary store the event data Ev.

A controller 650 performs a sequential control of the processes in the solid-state imaging device 600. For example, the controller 650 may control a threshold generation circuit 630 that determines and supplies thresholds to individual pixels 611 in the pixel array 610. A readout circuit 620 provides control signals for addressing the individual pixels 611 and outputs event position information. The event position information includes information about the position of those pixels 611 in the array of pixels 611, whose stored event data Ev indicate an event.

Figure 1B:
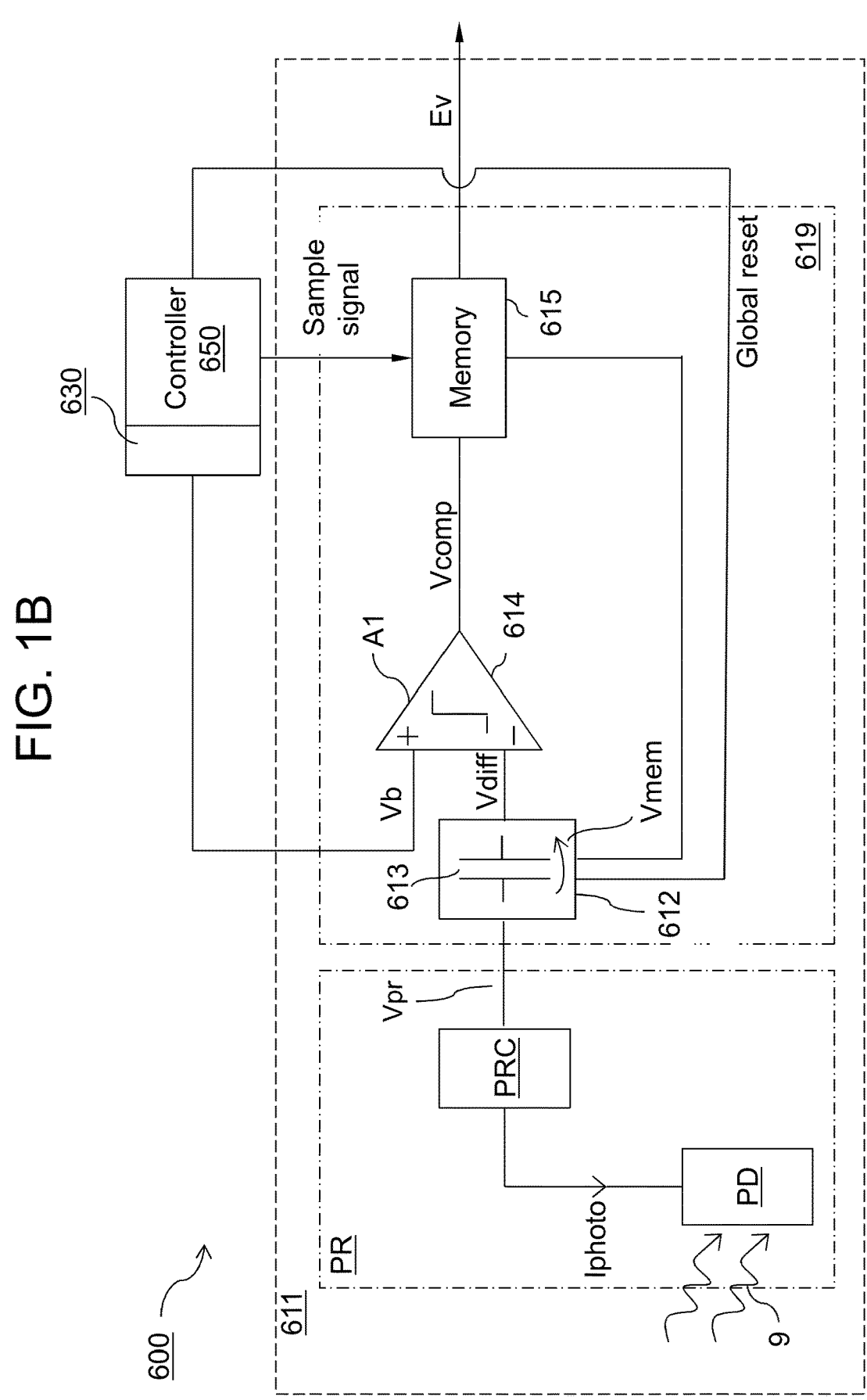
FIG. 1B is a simplified block diagram of a conventional pixel circuit for discussing background useful for understanding of the present disclosure.

FIG. 1B shows details of one of the pixels 611 of the pixel array 610 illustrated in FIG. 1A. Each pixel 611 includes a photoreceptor circuit block PR and is assigned to a pixel back-end 619. Each complete pixel back-end 619 may be assigned to one single photoreceptor circuit block PR. Alternatively, a pixel back-end 619 or parts thereof may be assigned to two or more photoreceptor circuit blocks PR, wherein a shared portion of the pixel back-end 619 may be sequentially connected to the assigned photoreceptor circuit blocks PR in a multiplexed manner.

The photoreceptor circuit block PR includes a photoelectric conversion element PD, e.g. a photodiode. The photoelectric conversion element PD converts impinging light 9 into a photocurrent Iphoto through the photoelectric conversion element PD. The amount of the photocurrent Iphoto depends on the light intensity of the impinging light 9, wherein in the range of interest the photocurrent Iphoto increases with increasing intensity of the detected light.

A photoreceptor circuit PRC converts the photocurrent Iphoto into a photoreceptor signal Vpr. The voltage of the photoreceptor signal Vpr is a function of the photocurrent Iphoto, wherein in the range of interest the voltage of the photoreceptor signal Vpr increases with increasing photocurrent Iphoto.

A voltage memory circuit 612 temporarily holds a memory voltage Vmem which amount depends on a previously evaluated voltage of the photoreceptor signal Vpr. The voltage memory circuit 612 updates the memory voltage Vmem when the pixel 611 has detected an event.

In particular, the voltage memory circuit 612 may include a memory capacitor 613 that receives the photoreceptor signal Vpr such that a first electrode of the memory capacitor 613 carries an amount of charge that depends on the photoreceptor signal Vpr and thus the intensity of light received by the photoelectric conversion element PD. A second electrode of the memory capacitor 613 is connected to a floating comparator node (inverting input) of a comparator circuit 614. A differential voltage Vdiff at the comparator node varies with changes in the photoreceptor signal Vpr.

The comparator circuit 614 compares the differential voltage Vdiff, which corresponds to the voltage difference between the current photoreceptor signal Vpr and the memory voltage Vmem, in other words the difference between the current photoreceptor signal Vpr and the past photoreceptor signal, with a threshold Vb. The comparator circuit 614 can be in each pixel back-end 619, or can be shared between a subset (for example a column) of pixels 611. According to an example, each pixel 611 includes a pixel back-end 619 including a comparator circuit 614, such that the comparator circuit 614 is integral to the pixel 611 and each pixel has a dedicated comparator circuit 614.

A memory element 615 may sample digital event data Ev reflecting the comparator output signal Vcomp output by the comparator circuit 614, e.g. in response to a sample signal from the controller 650. The memory element 615 may include a sampling circuit (for example a switch and a parasitic or explicit capacitor) and/or a digital memory circuit such as a latch or a flip-flop. In one embodiment, the memory element 615 may be a sampling circuit. The memory element 615 may be configured to store event data Ev including one, two or more binary bits. For example, the event data Ev may include a first bit indicating an increase of the photoreceptor signal Vpr to beyond an upper threshold and a second bit indicating a decrease of the photoreceptor signal Vpr to below a lower threshold.

An output signal of the memory element 615 (or another signal derived from the comparator output signal Vcomp) may control the voltage memory circuit 612 to set the inverting input of the comparator circuit 614 to a predefined potential in order to store the current voltage level of the photoreceptor signal Vpr as new memory voltage Vmem. The memory element 615 may be located in the pixel 611 or in the readout circuit 620 as shown in FIG. 1A. The output signal of the memory element 615 may be controlled in response to the content of the memory element 615.

In addition or in the alternative, a global reset signal received from the controller 650 may control the voltage memory circuit 612 to set the inverting input of the comparator circuit 614 to a predefined potential.

The solid-state imaging device 600 is operated as follows: A change in light intensity of incident radiation 9 translates into a change of the voltage level of the photoreceptor signal Vpr. Either continuously or at predetermined point in times designated by the controller 650, the comparator circuit 614 compares the differential voltage Vdiff at the inverting input (comparator node) to a threshold voltage Vb applied on its non-inverting input. If the differential voltage exceeds the threshold voltage Vb, the controller 650 operates the memory element 615 to store the comparator output signal Vcomp, e.g. as digital event data Ev.

If the state of the stored comparator output signal (event data) indicates a change in light intensity AND the global reset signal GlobalReset (controlled by the controller 650) is active, the voltage memory circuit 612 may reset the differential voltage Vdiff to a known level, wherein the memory voltage Vmem across the memory capacitor 613 is updated.

The memory element 615 may store the event data Ev indicating a change of the light intensity detected by the photoelectric conversion element PD by more than the threshold voltage Vb.

The solid state imaging device 600 may output event position information identifying those pixels 611 where a light intensity change has been detected. For example, the position information may include the row number and the column number of the pixel 611 in the pixel array 610.

A detected light intensity change at a given pixel is called an event. More specifically, the term 'event' means that the photoreceptor signal representing and being a function of light intensity of a pixel 611 has changed by an amount greater than or equal to a threshold applied by the controller 650 through the threshold generation circuit 630. To transmit an event, the address of the corresponding pixel 611 is transmitted along with data indicating whether the light intensity change was positive or negative. The data indicating whether the light intensity change was positive or negative may include one further single bit.

To detect light intensity changes between current and previous instances in time, each pixel 611 stores a representation of the light intensity at the previous instance in time. More concretely, each pixel 611 stores a memory voltage Vmem representing the photoreceptor signal Vpr at the time of the last event registered at the concerned pixel 611 and generates a differential voltage Vdiff representing the difference between the voltage level of the photoreceptor signal Vpr at the time of the last event registered at the concerned pixel 611 and the current photoreceptor signal Vpr at this pixel 611 (Vdiff=Vpr−Vmem).

To detect events, the differential voltage Vdiff at the comparator node may be first compared to a first threshold +Vb to detect an increase in light intensity (ON-event), and the comparator output is sampled on a (explicit or parasitic) capacitor or stored in a flip-flop. Then the differential voltage Vdiff at the comparator node may be compared to a second threshold −Vb to detect a decrease in light intensity (OFF-event) and the comparator output is sampled on a (explicit or parasitic) capacitor or stored in a flip-flop. Alternatively, the comparator circuit 614 may compare the differential voltage Vdiff to both thresholds +Vb, −Vb simultaneously.

The global reset signal is sent to all pixels 611, and in each pixel 611 this global reset signal may be logically ANDed with the sampled comparator outputs to reset only those pixels where an event has been detected. Then the sampled comparator output voltages (event data Ev) are read out, and the corresponding pixel addresses sent to a data receiving device.

Figure 2:
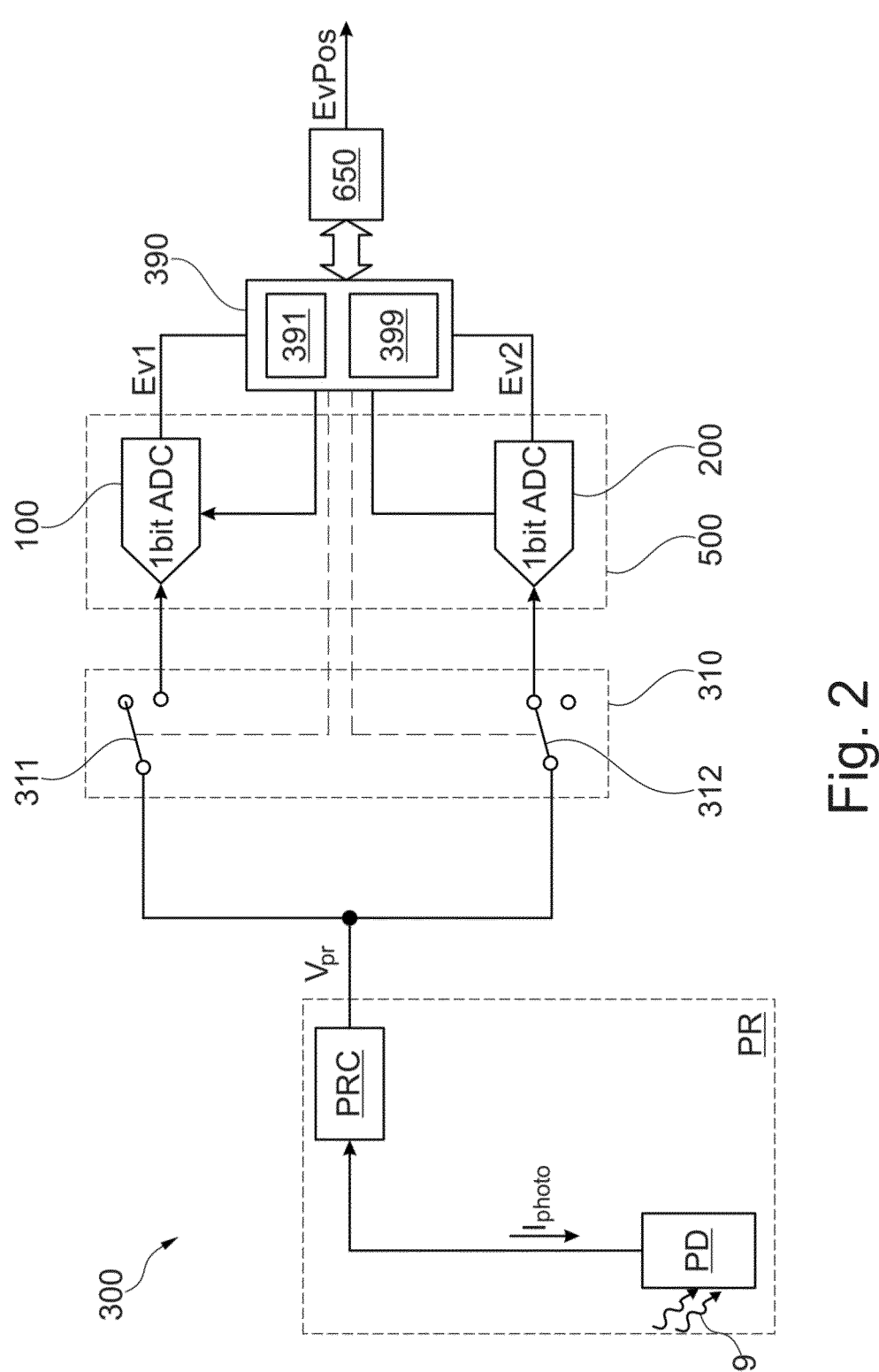
FIG. 2 is a simplified circuit diagram of a pixel circuit including an analog-to-digital converter stage with two inputs and an electronic switch assembly for passing a photoreceptor signal to the two inputs of the analog-to-digital converter stage according to an embodiment.

FIG. 2 shows a pixel circuit 300 according to the present disclosure. The pixel circuit 300 includes a photoreceptor circuit block PR, an electronic switch assembly 310 and an analog-to-digital converter stage 500. The photoreceptor circuit block PR generates a photoreceptor signal Vpr. The analog-to-digital converter stage 500 includes a first input and a second input. The analog-to-digital converter stage 500 compares a signal based on a first input signal applied to the first input with at least one first threshold voltage and compares a signal based on a second input signal applied to the second input with at least one second threshold voltage. The electronic switch assembly 310 passes the photoreceptor signal Vpr from the photoreceptor circuit block PR to the first input in a first operating state and passes the photoreceptor signal Vpr to the second input in a second operating state.

The photoreceptor circuit block PR may include a photoelectric conversion element PD. The photoelectric conversion element PD may be or may include one or more photodiodes or another type of photosensors. The photoelectric conversion element PD converts light 9 impinging on a sensitive surface of the photoelectric conversion element PD into a photocurrent Iphoto through the photoelectric conversion element PD. The amount of the photocurrent Iphoto is a function of the light intensity of the impinging light 9, wherein the photocurrent Iphoto increases with increasing intensity of the detected light 9.

A photoreceptor circuit PRC converts the photocurrent Iphoto into a photoreceptor signal Vpr. The voltage of the photoreceptor signal Vpr is a function of the photocurrent Iphoto, wherein the voltage of the photoreceptor signal Vpr increases with increasing photocurrent Iphoto. The photoreceptor signal Vpr may be available at an output of the photoreceptor circuit block PR.

The electronic switch assembly 310 includes at least a first electronic switch 311 with a first side electrically connected to the output of the photoreceptor circuit block PR and includes a second electronic switch 312 with a first side electrically connected to the output of the photoreceptor circuit block PR. The electronic switch assembly 310 may include more than the two electronic switches 311, 312, wherein the first side of each further electronic switch is electrically connected to the output of the photoreceptor circuit block PR.

Electrically connected electronic elements may be electrically connected through a direct, permanent low-resistive connection, e.g., through a conductive line. The term "electrically connected" may include connection through other electronic elements provided and suitable for permanent and/or temporary signal transmission and/or transmission of energy. For example, electronic elements may also be electrically connected through electronic switches such as transistors or transistor circuits, e.g. MOSFETs, transmission gates, and others.

Each of the electronic switches 311, 312 may include one n-channel MOSFET (metal-oxide-semiconductor field effect transistor), one p-channel MOSFET, or a combination of two or more MOSFETs. For example, each electronic switch 311, 312 may be or may include a transmission gate with the source-to-drain paths of an n-channel MOSFET and a p-channel MOSFET electrically connected in parallel.

The analog-to-digital converter stage 500 derives digital event data Ev1, Ev2 from each of the input signals. For example, the analog-to-digital converter stage 500 may be configured to perform a 1-bit analog-to-digital conversion with or without sign with respect to each input signal. Event data Ev1 may include two bits and event data Ev2 may include two bits, wherein in each case a first bit indicates whether or not the input signal or a signal derived from the input signal exceeds an upper threshold and the second bit indicates whether or not the input signal or a signal derived from the input signal falls below a lower threshold.

The analog-to-digital converter stage 500 may include at least a first converter stage 100 and a second converter stage 200. The first converter stage 100 generates first event data Ev1 on the basis of the first input signal. The second converter stage 200 generates second event data Ev2 from the second input signal.

In particular, a second side of the first electronic switch 311 and an input of the first converter stage 100 are electrically connected. A second side of the second electronic switch 312 and an input of the second converter stage 100 are electrically connected. The analog-to-digital converter stage 500 may include more than the first and second converter stages 100, 200, wherein the input of any further converter stage is electrically connected with a second side of a further electronic switch of the electronic switch assembly 310.

The first and second converter stages 100, 200 may include different electronic circuits or may share some electronic circuits. In each case, the first and second converter stages 100, 200 are capable to process the input signals applied to the first and second inputs of the analog-to-digital converter stage 500 independently from each other such that processing of the first input signal is without effect on the result of the processing of the second input signal and such that processing of the second input signal is without effect on the result of the processing of the first input signal.

The first converter stage 100 outputs first event data Ev1 indicating whether or not the first converter stage 100 detects an event. The second converter stage 200 outputs second event data Ev2 indicating whether or not the second converter stage 200 detects an event.

Each converter stage 100, 200 may first derive a signal from the input signal and may then convert the signal derived from the input signal into event data Ev1, Ev2. For example, each converter stage 100, 200 may subtract a variable offset voltage (memory voltage) from the photoreceptor signal Vpr to obtain a differential voltage and may then convert the differential voltage into the digital event data Ev1, Ev2. The variable offset voltage may be equal to a voltage level of the photoreceptor signal Vpr at that point in time when the precedent event data Ev1, Ev2 of the respective converter stage 100, 200 is retrieved from the pixel circuit 300.

A memory circuit 399, which may include the memory element 615 as described with respect to FIG. 2, stores the event data Ev1, Ev2 and from the stored event data Ev1, Ev2 a controller 650 retrieves event position information EvPos. At the same time the controller 650 may reset the event data Ev1, Ev2.

A first control circuit 391 controls the electronic switch assembly 310 based on at least one output signal of the analog-to-digital converter stage 500. In particular, the operating state of the electronic switch assembly 310 may change in response to a change of the event data Ev1, Ev2, i.e., in response to a detected event.

The first control circuit 391 may control the electronic switch assembly 310 in a way such that the first electronic switch 311 passes the photoreceptor signal Vpr to the first converter stage 100 in a first operating state and to the second converter stage 200 in a second operating state.

The first control circuit 391 may switch the electronic switch assembly 310 into the second operating state, when a first output signal of the analog-to-digital converter stage 500 indicates that the first input signal exceeds an upper first threshold or falls below a lower first threshold. The first input signal exceeds the upper first threshold when a voltage level of the first input signal exceeds a voltage level of the upper first threshold. The first input signal falls below the lower first threshold when a voltage level of the first input signal falls below a voltage level of the lower first threshold.

The first control circuit 391 may switch the electronic switch assembly 310 into the first operating state, when a second output signal of the analog-to-digital converter stage 500 indicates that the second input signal exceeds an upper second threshold or falls below a lower second threshold. The second input signal exceeds the upper second threshold when a voltage level of the second input signal exceeds a voltage level of the upper second threshold. The second input signal falls below the lower second threshold when a voltage level of the second input signal falls below a voltage level of the lower second threshold.

In the first operating state, the first electronic switch 311 is "on" and connects the output of the photoreceptor circuit block PR and the first input of the analog-to-digital converter stage 500, whereas the second electronic switch 312 may be "off" and the second input of the analog-to-digital converter stage 500 is disconnected from the output of the photoreceptor circuit block PR.

In the second operating state, the first electronic switch 311 may be "off" and the first input of the analog-to-digital converter stage 500 is disconnected from the output of the photoreceptor circuit block PR, whereas the second electronic switch 312 is "on" and electrically connects the output of the photoreceptor circuit block PR and the second input of the analog-to-digital converter stage 500.

Operation of the pixel circuit 300 may start with the electronic switch assembly 310 being in the first operating state and passing the photoreceptor signal Vpr to the first converter stage 100. When the first converter stage 100 detects an event, the memory circuit 399 stores corresponding first event data Ev1 until such time as the controller 650 retrieves and/or resets the first event data Ev1.

Conventionally, with no second converter stage 200, events occurring in the time period between event setting and event resetting either overwrite the event data (if the first converter stage 100 remains active and the photoreceptor signal returns to a previous level) or are missed (if the first converter stage 100 is deactivated and the photoreceptor signal Vpr again changes).

Instead, in the pixel circuit 300 detection of an event by the first converter stage 100 triggers the first control circuit 391 to control the second electronic switch 312 to pass the photoreceptor signal Vpr to the second converter stage 200. The second converter stage 200 is capable of detecting events starting almost immediately after event detection in the first converter stage 100.

Simultaneously, the first control circuit 391 may control the first electronic switch 312 to disconnect the photoreceptor signal Vpr from the first converter stage 100. The first event data Ev1 is save from being overwritten before being read out. The probability for losing significant information is reduced.

Disconnecting the photoreceptor signal Vpr from the first converter stage 100 may avoid that the first event data Ev1 is overwritten when the photoreceptor signal Vpr returns to a previous value. The capacitive load of the photoreceptor signal Vpr remains unaffected. Capacitive loading is reduced and therefore speed may be improved. In addition, operation of the second converter stage 200 can be decoupled from switching processes in the second converter stage 100, which otherwise could adversely affect operation of the second converter stage 200.

The electronic switch assembly 310 enables sequentially passing the photoreceptor signal Vpr from one single photoreceptor circuit block PR to at least two inputs of the analog-to-digital converter stage 500. The analog-to-digital converter stage 500 processes the input signals on the at least two inputs under consideration of predefined threshold voltages and allows separated processing of the two or more input signals.

In particular, passing the photoreceptor signal Vpr from a first one of the converter stages 100, 200 to a second one after the detection of an event by processing the photoreceptor signal Vpr applied to the first one of the converter stages 100, 200, enables the detection of further changes in light intensity even before the previous event detected by the pixel circuit 300 has been retrieved from the pixel circuit 300.

In the pixel circuit 300 illustrated in FIG. 3A the first comparator stage 100 includes a first converter circuit 120 and a first voltage memory circuit 110 electrically connected in series between the first electronic switch 311 and the first converter circuit 120. The second comparator stage 200 includes a second converter circuit 220 and a second voltage memory circuit 210 electrically connected in series between the second electronic switch 312 and the second converter circuit 220.

The first voltage memory circuit 110 is electrically connected to the first electronic switch 311 of the electronic switch assembly 310. The first voltage memory circuit 110 generates a first differential voltage Vdiff1, e.g. by subtracting a variable first offset voltage from the first input signal. The second voltage memory circuit 210 is electrically connected to the second electronic switch 312 of the electronic switch assembly 310. The second voltage memory circuit 210 generates a second differential voltage Vdiff2, e.g. by subtracting a variable second offset voltage from the second input signal.

The variable first offset voltage (first memory voltage) is equal to or approximates to a high degree the voltage level of the first input voltage at that preceding point in time at which the preceding first event data Ev1 has been read out from the pixel circuit 300. The first offset voltage may result from the voltage drop a stored charge generates across a first memory capacitor. Accordingly, the second variable offset voltage is equal to or approximates to a high degree the voltage level of the second input voltage at that preceding point in time at which the preceding second event data Ev2 has been read out from the pixel circuit 300. The second offset voltage results from the voltage drop a stored charge generates across a second memory capacitor, by way of example.

The first converter circuit 120 generates the first event data Ev1 based on the first input signal and the second converter circuit 220 generates the second event data Ev2 based on the second input signal.

In particular, the first converter circuit 120 converts the first differential voltage Vdiff1 into the first event data Ev1 by 1-bit analog-to-digital conversion with or without sign and the second converter circuit 120 converts the second differential voltage Vdiff2 into the second event data Ev2 by 1-bit analog-to-digital conversion with or without sign.

Further in FIG. 3A, the analog-to-digital converter stage 500 simultaneously compares the signal derived from the first input signal with the upper first threshold and with the lower first threshold. In addition, the analog-to-digital converter stage 500 simultaneously compares the signal derived from the second input signal with the upper second threshold and with the lower second threshold.

In particular, the first converter circuit 120 may include a first upper comparator 121 comparing the first differential voltage Vdiff1 with a positive first threshold voltage +Vb1 and a first lower comparator 122 comparing, at the same time, the first differential voltage Vdiff1 with a negative first threshold voltage −Vb1. The first upper comparator 121 outputs a first upper event bit Ev1h indicating whether or not the first differential voltage Vdiff1 exceeds the positive first threshold voltage +Vb1. The first lower comparator 122 outputs a first lower event bit Ev1l indicating whether or not the first differential voltage Vdiff1 falls below the negative first threshold voltage −Vb1.

For example, logic "1" at the output of the first upper comparator 121 may indicate that the first differential voltage Vdiff1 exceeds the upper threshold. Logic "1" at the output of the first lower comparator 122 may indicate that the first differential voltage Vdiff1 falls below the lower threshold. Each logic "1" indicates an event. Logic "0"s at both outputs indicate the absence of events.

The second converter circuit 220 may include a second upper comparator 221 comparing the second differential voltage Vdiff2 with a positive second threshold voltage +Vb2 and a second lower comparator 222 comparing the second differential voltage Vdiff2 with a negative second threshold voltage −Vb2. The second upper comparator 221 outputs a second upper event bit Ev2h indicating whether or not the second differential voltage Vdiff2 exceeds the positive second threshold voltage +Vb2. The second lower comparator 222 outputs a second lower event bit Ev2l indicating whether or not the second differential voltage Vdiff2 falls below the negative second threshold voltage −Vb2.

The first and second upper threshold voltages +Vb1, +Vb2 may be equal or approximately equal. The first and second lower threshold voltages −Vb1, −Vb2 may be equal or approximately equal. The positive and negative threshold voltages of the same converter circuit 120, 220 may have the same or approximately the same amount.

The memory circuit 399 may include four 1-bit storage elements for temporarily storing the event data bits Ev1h, Ev1l, Ev2h, Ev2l. The storage elements may include latches or sample/hold circuits, by way of example. The memory circuit 399 passes the event data bits to a controller 650 according to a predetermined protocol with or without handshake. For example, the controller 650 may check and reset the event data Ev at regular intervals and/or as needed.

The first control circuit 391 may close the second electronic switch 312 and open the first electronic switch 311 after detection of an event for the first differential voltage Vdiff1. The first control circuit 391 may close the first electronic switch 311 and open the second electronic switch 312 after detection of an event for the second differential voltage Vdiff2.

In FIG. 3B the analog-to-digital converter stage 500 includes a shared converter circuit 150 that sequentially, e.g. alternatingly, generates the first event data Ev1 based on the first input signal and the second event data Ev2 based on the second input signal.

In particular, both the first converter stage 100 and the second converter stage 200 may use the shared converter circuit 150. The shared converter circuit 150 may include a shared upper comparator 151 alternatingly comparing the first differential voltage Vdiff1 and the second differential voltage Vdiff2 with a positive threshold voltage +Vb and a shared lower comparator 152 alternatingly comparing the first differential voltage Vdiff1 and the second differential voltage Vdiff2 with a negative threshold voltage −Vb.

A supplementary electronic switch 153 may alternatingly connect the comparator input of the shared converter circuit 150 with an output of the first voltage memory circuit 110 or with an output of the second voltage memory circuit 210.

The supplementary electronic switch 153 may include one n-channel MOSFET (metal-oxide-semiconductor field effect transistor), one p-channel MOSFET, or a combination of two or more MOSFETs. For example, the supplementary electronic switch 153 may be or may include a transmission gate with the source-to-drain paths of an n-channel MOSFET and a p-channel MOSFET electrically connected in parallel.

The supplementary electronic switch 153 may switch synchronously or almost synchronously with the electronic switch assembly 310. For example, the supplementary electronic switch 153 may connect the output of the first voltage memory circuit 110 with the input of the shared converter circuit 150 in the first operating state. The supplementary electronic switch 153 may connect the output of the second voltage memory circuit 210 with the input of the shared converter circuit 150 in the second operating state.

FIG. 4 refers to details of the first and second voltage memory circuits 110, 210 in the pixel circuits 300 of FIGS. 3A and 3B.

In particular, the pixel circuit 300 may include a first memory capacitor 111 and a first voltage memory reset circuit 112, wherein the first memory capacitor 111 is electrically connected in series between the first electronic switch 311 and the first memory reset circuit 112. In addition, the pixel circuit 300 includes a second memory capacitor 211 and a second voltage memory reset circuit 212, wherein the second memory capacitor 211 is electrically connected in series between the second electronic switch 312 and the second memory reset circuit 212.

A first electrode of the first memory capacitor 111 and the second side of the first electronic switch 311 are electrically connected. A second electrode of the first memory capacitor 111 is electrically connected with the first voltage memory reset circuit 112. In a reset mode, the first voltage memory reset circuit 112 resets the comparator node of the first converter circuit 120 (and the first differential signal Vdiff1) to a predetermined voltage Vref1. In a tracking mode of the first voltage memory reset circuit 112, the first differential signal Vdiff1 follows the voltage difference between the photoreceptor signal Vpr and a first memory voltage Vmem1 dropping across the first memory capacitor 111.

Accordingly, a first electrode of the second memory capacitor 211 and the second side of the second electronic switch 312 are electrically connected. A second electrode of the second memory capacitor 211 is electrically connected with the second voltage memory reset circuit 212. In a reset mode, the second voltage memory reset circuit 212 resets the comparator node of the second converter circuit 220 (and the second differential signal Vdiff2) to a predetermined voltage Vref2. In a tracking mode of the second voltage memory reset circuit 212, the second differential signal Vdiff2 follows the voltage difference between the photoreceptor signal Vpr and a second memory voltage Vmem2 dropping across the second memory capacitor 211.

An auxiliary control circuit 393 controls the first and second memory reset circuits 112, 212 based on at least one output signal of the analog-to-digital converter stage 500 or the memory circuit 399. In particular, the auxiliary control circuit 393 may control the first and second memory reset circuits 112, 212 in response to a change of at least one of the output signals of the analog-to-digital converter stage 500.

The predetermined voltages Vref1, Vref2 may be equal or approximately equal. The predetermined voltages Vref1, Vref2 may be static voltages. For example, the predetermined voltages Vref1, Vref2 may be 0V or any other voltage permanently obtained by voltage dividers and/or reference voltage sources from the supply voltages of the pixel circuit 300. Alternatively, the predetermined voltages may be only temporarily provided, e.g. only during the second operating modes of the voltage memory reset circuits 112, 212.

In FIG. 5 the first converter circuit 120 includes a first single comparator 123 and the second converter circuit 220 includes a second single comparator 223. The lower and upper thresholds are sequentially supplied to the non-inverting comparator input through the threshold generation circuit 630. The event data for the two thresholds may be passed to different memory elements of the memory circuit 399.

For the reset mode of the first memory reset circuit 112, the threshold voltage Vb may be set to a predetermined voltage with a voltage level in the middle between the lower threshold and the upper threshold, e.g. about 0V. In the reset mode, the first memory reset circuit 112 connects the output of the first single comparator 123 with the inverting input of the first single comparator 123. The resulting first differential signal Vdiff1 may approximate the inherent offset voltage of the first single comparator 123. By applying the same reset mechanism to all pixel circuits 300 of a pixel array 610, the effect of different offset voltages may be compensated. The same applies to the second memory reset circuit 212 and the second converter circuit 220 with a second single comparator 223 accordingly.

FIG. 6 shows a pixel circuit 300 with the first memory reset circuit 112 including a first voltage amplifier 113, a first feedback capacitor 114 and a first switching element 119. The first memory reset circuit 112 is configured such that in an off-state of the first switching element 119 the first feedback capacitor 114 is effective between an input and an output of the first voltage amplifier 113 and such that in an on-state of the first switching element 119 the first feedback capacitor 114 is short-circuited.

Accordingly, the second memory reset circuit 212 includes a second voltage amplifier 213, a second feedback capacitor 214 and a second switching element 219. The second memory reset circuit 212 is configured such that in an off-state of the second switching element 219 the second feedback capacitor 214 is effective between an input and an output of the second voltage amplifier 213 and such that in an on-state of the second switching element 219 the second feedback capacitor 214 is short-circuited.

Each of the first and second switching elements 119, 219 may include one n-channel MOSFET (metal-oxide-semiconductor field effect transistor), one p-channel MOSFET, or a combination of two or more MOSFETs. For example, each of the first and second electronic switching elements 119, 219 may be or may include a transmission gate with the source-to-drain paths of an n-channel MOSFET and a p-channel MOSFET electrically connected in parallel.

In the reset mode of the first memory reset circuit 112, the first switching element 119 is "on" and short-circuits the electrodes of the first feedback capacitor 114, which is discharged. The first voltage amplifier 113 is effectively in unity gain feedback and the voltage VA1 at the inverting input of the first voltage amplifier 113 is forced to VSS plus the offset voltage of the first voltage amplifier 113.

In the tracking mode, the first electronic switch 311 is "on". The first switching element 119 is "off" and the first feedback capacitor 114 is charged through the first memory capacitor 111. The output voltage of the first voltage amplifier 113 changes accordingly to correct the voltage at the virtual ground at its inverting input. As a result, the first differential signal Vdiff1 proportionately follows the photoreceptor signal Vpr.

Accordingly, in the reset mode of the second memory reset circuit 212, the second switching element 219 is "on" and short-circuits the electrodes of the second feedback capacitor 214, which is discharged. The second voltage amplifier 213 is effectively in unity gain feedback and the voltage VA2 at the inverting input of the second voltage amplifier 213 is forced to VSS plus the offset voltage of the second voltage amplifier 213.

In the tracking mode, the second electronic switch 312 is "on". The second switching element 219 is "off" and the second feedback capacitor 214 is charged through the second memory capacitor 211. The output voltage of the second voltage amplifier 213 changes accordingly to correct the voltage at the virtual ground at its inverting input. As a result, the second differential signal Vdiff2 proportionately follows the photoreceptor signal Vpr.

The first memory reset circuit 112 in the first converter stage 120 may be in the reset mode as long as the electronic switch assembly 310 passes the photoreceptor signal Vpr to the input of the second converter stage 200 in order to avoid integrating noise and/or leakage current in the first voltage memory circuit 110. Accordingly, the second memory reset circuit 212 in the second converter stage 220 may be in the reset mode as long as the electronic switch assembly 310 passes the photoreceptor signal Vpr to the input of the first converter stage 100 in order to avoid integrating noise and/or leakage current in the second voltage memory circuit 210.

The pixel circuit 300 includes an auxiliary control circuit 393 that controls the first switching element 119 such that the first switching element 119 switches to the off-state when the electronic switching assembly 310 changes to the first operating state and such that the first switching element 119 switches to the on-state when the electronic switching assembly 310 changes to the second operating state. In addition, the auxiliary control circuit 393 controls the second switching element 219 such that the second switching element 219 switches to the off-state when the electronic switching assembly 310 changes to the second operating state and switches to the on-state when the electronic switching assembly 310 changes to the first operating state.

In other words, the first voltage memory reset circuit 112 is predominantly in the reset mode when the second electronic switch 312 passes the photoreceptor signal Vpr to the second converter stage 200. The first voltage memory reset circuit 112 is predominantly in the tracking mode when the first electronic switch 311 passes the photoreceptor signal Vpr to the first converter stage 100. The second voltage memory reset circuit 212 is predominantly in the reset mode when the first electronic switch 311 passes the photoreceptor signal Vpr to the first converter stage 100. The second voltage memory reset circuit 212 is predominantly in the tracking mode when the second electronic switch 312 passes the photoreceptor signal Vpr to the second converter stage 200.

FIG. 7A shows a pixel circuit 300 with a first control circuit 391 and an auxiliary control circuit 393 and FIG. 7B shows a time diagram for voltage signals in the pixel circuit 300.

The first control circuit 391 includes OR gates 396 connected to the four outputs of the analog-to-digital converter stage 500. The OR gates 396 generate a pixel event signal Ev_any indicating that the analog-to-digital converter stage 500 has detected any kind of event. Logic "1" of the pixel event signal Ev_any may indicate detection of an event.

A digital frequency divider circuit 397 may output complementary binary first control signals sw, nsw. The first binary control signal sw controls the first electronic switch 311, wherein a logic "1" may turn on the first electronic switch 311. The inverted first binary control signal nsw controls the second electronic switch 312, wherein a logic "1" may turn on the second electronic switch 312. The digital frequency divider circuit 397 may include a binary counter clocked by the pixel event signal Ev_any, e.g. a positive edge triggered D flip flop in feedback, e.g. with the inverting output connected to the data input ("D").

The complementary first binary control signals sw, nsw change with any incoming leading edge of the pixel event signal Ev_any. As soon as any of the converter stages 100, 200 detects an event, the electronic switching assembly 310 passes the photoreceptor signal Vpr to the other converter stage 200, 100.

In addition, the first control circuit 391 may receive further event data from the memory circuit 399 and may hold both memory reset circuits 112, 212 in the reset mode after both converter stages 100, 200 have detected an event and as long as none of the events has been acknowledged by the controller 650.

The auxiliary control circuit 393 receives the first binary control signals sw, nsw and outputs complementary second binary control signals dsw, dnsw, which are delayed with respect to the first binary control signals sw, nsw by at least one gate propagation delay. The second binary control signal dsw controls the second switching element 219, wherein logic "1" may turn on the second switching element 219. The inverted second binary control signal dnsw controls the first switching element 119, wherein logic "1" may turn on the first switching element 119.

In particular, the auxiliary control circuit 393 is configured to delay, by at least one gate propagation delay, trailing and falling edges of the second control signals controlling the first and second switching elements 119, 219 with respect to corresponding edges of the first control signals controlling the first and second electronic switches 311, 312.

FIG. 7B shows a time diagram of the pixel event signal Ev_any, the complementary first control signals sw, nsw and the complementary second control signals dsw, dnsw for a given, slowly changing photoreceptor signal Vpr. In addition, the time diagram shows the first differential signal Vdiff1 at the inverting input of the first converter circuit 120 and the second differential signal Vdiff2 at the inverting input of the second converter circuit 220 of FIG. 7A.

At t=t0 the first electronic switch 311 is "on" (sw="1") and the first switching element 119 is "off" (dnsw="0"). The first electronic switch 311 passes the photoreceptor signal Vpr to the first converter stage 100. The first converter stage 100 is in the tracking mode and checks the first differential signal Vdiff1 ("Vdiff1=Vi_1−Vmem1") against the upper and lower thresholds.

The second electronic switch 312 is "off" (nsw="0") and the second switching element 119 is "on" (dsw="1"). The second electronic switch 312 decouples the second converter stage 200 from the photoreceptor signal Vpr and the second input voltage Vin_2 remains unchanged.

Starting from t=t0 the photoreceptor signal Vpr gradually rises. The first input signal Vin_1 and the first differential signal Vdiff1 rise accordingly until at t=t1 the first differential signal Vdiff1 exceeds the upper threshold of the first converter stage 100. The corresponding output signal of the first comparator stage 100 changes to "1" and the pixel event signal Ev_any rises.

At t=t2 the rising edge of the pixel event signal Ev_any triggers a synchronous change of the first binary control signals sw, nsw.

At t=3 the edges of the first binary control signals sw, nsw trigger switching of the first and second electronic switches 311, 312. In addition the first binary control signals sw, nsw trigger a synchronous change of the complementary second control signals dsw, dnsw. The trailing and rising edges of the second control signals dsw, dnsw may be delayed by one gate propagation delay.

With sw changing from "1" to "0", the first electronic switch 311 switches from "on" to "off" and decouples the photoreceptor signal Vpr from the first converter stage 100. With nsw changing from "0" to "1" the second electronic switch 312 switches from "off" to "on" and passes the photoreceptor signal Vpr to the second converter stage 200 such that the second input signal Vin_2 starts tracking the photoreceptor signal Vpr.

At t=t4, the first switching element 119 turns "on" (dnsw="1"), wherein the first converter stage 100 changes into the reset mode. In the reset mode the first voltage amplifier 113 is effectively in unity gain feedback and the voltage VA1 at the inverting input of the first voltage amplifier 113 is forced to VSS plus the offset voltage of the first voltage amplifier 113. The first differential signal Vdiff1 is approximately 0V and safely within the margins set by the upper and lower threshold. The second switching element 219 turns "off" (dsw="0"), wherein the second converter stage 200 changes into the tracking mode. In the tracking mode, the second differential signal Vdiff2 qualitatively follows the photoreceptor signal Vpr. As long as the second differential signal Vdiff2 is within the margin, both outputs of the first converter stage 100 are reset to "0" and, as a consequence, the pixel event signal Ev_any changes to "0".

After t=t4, the first converter stage 100 and the second converter stage 200 have changed their operational mode.

In first periods A1 only the first converter stage 100 is active and in the tracking mode. In second periods A2 only the second converter stage 200 is active and in the tracking mode. In intermediate periods A0, which are comparatively short, the analog-to-digital converter stage 500 is in an idle state without tracking the photoreceptor signal Vpr.

FIG. 8 shows a pixel circuit 300 with a collision detection circuit 380 that outputs a collision detection signal col_d based on output signals of the analog-to-digital converter stage 500.

In particular, the memory circuit 399 may include storage elements 397 holding the event data and a handshake circuit 398. Each storage element 397 may store one bit event data according to the output signals of the comparator stages 100, 200. The handshake circuit 398 communicates with the controller 650 and resets a storage element 397 after the controller 650 has acknowledged receipt of the information about the content of the storage element 397.

The collision detection circuit 380 may include two OR gates 381. Each OR gate may output "1" if at least one of the event data bits assigned to the same converter stage 100, 200 indicates an event. A "1" at the output of an AND gate 382 indicates that the memory circuit 399 holds event data for both converter stages 100, 200. The output of the AND gate may set a latch 383 outputting the collision detection signal col_d to the controller 650. The controller 650 may reset the latch 383 for acknowledging receipt of the collision detection signal col_d.

FIG. 9 shows a pixel circuit 300 with a collision control circuit 395 that controls at least the electronic switch assembly 310 based on the collision detection signal col_d. In response to an active collision detection signal cold, the collision control circuit 395 may effect that both converter stages 100, 200 are simultaneously in the reset mode for some time. Insofar, the collision control circuit 395 may overwrite the effect of the first control circuit 391 and the auxiliary control circuit 393.

A further logic gate may combine the collision detection signal col_d with a collision configuration signal col_cfg generated by the controller 650 in order to activate/deactivate the collision control circuit 395 according to settings in the controller 650.

FIG. 10 refers to an analog-to-digital converter stage 500 including a shared converter circuit 150 that sequentially, e.g. alternatingly, generates the first event data based on the first input signal and the second event data based on the second input signal as shown in FIG. 3B.

A first buffer circuit 141 is electrically connected between the first voltage memory circuit 110 and the supplementary electronic switch 153. A second buffer circuit 142 is electrically connected between the second voltage memory circuit 210 and the supplementary electronic switch 153. The first and second buffer circuits 141, 142 may include sample/hold circuits and/or amplifying stages.

FIG. 11 shows two pixel circuits 300, each of them including a photoreceptor circuit block PR and a pixel back-end 301. Each photoreceptor circuit block PR includes a photoelectric conversion element PD and a photoreceptor circuit PRC outputting a photoreceptor signal Vpr. Each pixel back-end 301 includes an electronic switch assembly with a first electronic switch 311 and with a second electronic switch 312, an analog-to-digital converter stage 500 and a control unit 390. A controller 650 receives and acknowledges the event data Ev.

The control unit 390 may include the memory circuit 399, the first control circuit 391, the auxiliary control circuit 393, and, if applicable, the collision detection circuit 380 and/or the collision control circuit 395 as described with reference to FIGS. 3-10. For each pixel 300 the controller 650 evaluates and, if applicable, resets the event data Ev and outputs event position information EvPos identifying pixels 300 that have detected an event.

FIG. 12 shows a photoreceptor circuit block PR including an intensity readout circuit 740. The intensity readout circuit 740 transforms the photocurrent Iphoto flowing through the photoelectric conversion element PD into a voltage signal Vpix with a voltage level depending on a magnitude of the photocurrent Iphoto.

The intensity readout circuit 740 may be adapted to determine the magnitude of the photocurrent Iphoto through the photoelectric conversion element PD of the photoreceptor circuit block PR at given points in time and outputs the voltage signal Vpix, which voltage level depends on the photocurrent Iphoto on a vertical signal line VSL. The vertical signal line VSL may be shared by all pixels arranged along the same column of pixels in the pixel array.

In the illustrated embodiment of the intensity readout circuit 740, an n-channel anti-blooming MOSFET 745 and an n-channel decoupling MOSFET 746 are electrically connected in series between the high supply voltage VDD and the photoelectric conversion device PD. The anti-blooming MOSFET 745 and the decoupling MOSFET 746 are controlled by fixed bias voltages Vbias3, Vbias4 applied to the gates of the MOSFETs 745, 746. Additional elements, e.g. a controlled path of a feedback portion of the photodetector circuit PRC may be electrically connected in series between the decoupling MOSFET 746 and the photoelectric conversion device PD.

Decoupling MOSFET 746 may basically decouple the photodetector circuit PRC from voltage transients at the center node 748 between the MOSFETs 746, 747. Anti-blooming MOSFET 745 may ensure that the voltage at the center node 748 does not fall below a certain level given by the difference between Vbias4 and the threshold voltage of the anti-blooming MOSFET 745 in order to ensure proper operation of the photodetector circuit PRC.

The source of an n-channel transfer MOSFET 741 is electrically connected to the center node 748. A drain of the re-channel transfer MOSFET 741 is electrically connected to the gate of an n-channel amplifier MOSFET 743. The gate of the n-channel transfer MOSFET 741 receives a transfer signal TX.

The drain of an n-channel reset MOSFET 742 is electrically connected to the high supply potential VDD. A source of the reset MOSFET 742 is electrically connected to the gate of the amplifier MOSFET 743 and to the drain of the transfer MOSFET 741. The gate of the reset MOSFET 742 receives a reset signal RESET.

The reset signal RESET switches on the reset MOSFET 742 for a short time such that the gate of the amplifier MOSFET 743 is set to a potential close to the high supply potential VDD. With the reset MOSFET 742 switched off again, when the transfer signal TX switches on the transfer MOSFET 741, an amount of charge proportional to the magnitude of the photocurrent Iphoto is discharged from the gate of the amplifier MOSFET 743.

The amplifier MOSFET 743, an n-channel selection MOSFET 744, a vertical signal line VSL and an n-channel current source MOSFET 621 with biased gate are electrically connected in series in this order between the high supply potential VDD and the low supply potential VSS. The gate of the selection MOSFET 744 receives a selection signal Sel. When the selection signal Sel switches on the selection MOSFET 744, a voltage signal Vpix with a voltage level proportional to the amount of charge on the gate of the amplifier MOSFET 743 drops across the drain/source path of the current source MOSFET 621.

The current source MOSFET 621 and a column amplifier circuit 622 for amplifying and/or buffering the voltage signal Vpix may be integrated in the readout circuit 620 of the solid-stage imaging device 600 as illustrated in FIG. 1A. The column amplifier circuit 622 further processes the voltage signal Vpix, which voltage level is a function of the photocurrent Iphoto at that point in time, when the transfer MOSFET 741 has been in the on state.

Alternative embodiments of the intensity readout circuit 740 may be realized without transfer MOSFET, wherein the reset MOSFET may replace the anti-blooming MOSFET 745, and wherein the source of such reset MOSFET is directly connected to the gate of the amplifier MOSFET 743.

In the photoreceptor circuit block of FIG. 12, the intensity detection circuit 740 and the photoreceptor circuit PRC for event detection are electrically connected in series with respect to the photocurrent Iphoto, wherein evaluation of intensity and detection of events may be performed substantially contemporaneously.

The photoreceptor circuit block PR in FIG. 13 includes a photocurrent routing circuit 707, 747. The photocurrent routing circuit 707, 747 electrically connects the photoelectric conversion element PD with the photoreceptor circuit PRC in a first operating state. The photocurrent routing circuit 707, 747 electrically connects the photoelectric conversion element PD with the intensity readout circuit 740 in a second operating state.

In addition, the photocurrent routing circuit 707, 747 disconnects the photoelectric conversion element PD from the intensity readout circuit 740 in the first operating state and disconnects the photoelectric conversion element PD from the photoreceptor circuit PRC in the second operating state.

The photocurrent routing circuit 707, 747 may include two electronic switches, e.g. MOSFETs. For example, a source of an n-channel first transfer MOSFET 707 is electrically connected to the cathode of the photoelectric conversion element PD. A drain of the first transfer MOSFET 707 is electrically connected to the input of the photoreceptor circuit PRC.

A source of an n-channel second transfer MOSFET 747 is electrically connected to the cathode C of the photoelectric conversion element PD. A drain of the second transfer MOSFET 747 is electrically connected to the source of the reset MOSFET 742 and to the gate of the amplifier MOSFET 743 as described with respect to FIG. 12.

The gate of the first transfer MOSFET 707 receives a first transfer signal TGD1. The gate of the second transfer MOSFET 747 receives a second transfer signal TG1. When the first transfer signal TGD1 switches on the first transfer MOSFET 707 and the second transfer signal TG1 switches off the second transfer MOSFET 747, the photoreceptor circuit block PR is in an event detection mode. When the first transfer signal TGD1 switches off the first transfer MOSFET 707 and the second transfer signal TG1 switches on the second transfer MOSFET 747, the photoreceptor circuit block PR is in an intensity readout mode.

Since in the intensity readout mode the photoreceptor circuit PRC for event detection is disconnected from the photoelectric conversion element PD, the intensity readout may be more precise and may deliver better image quality.

FIG. 14 is a perspective view showing an example of a laminated structure of a solid-state imaging device 23020 with a plurality of pixels arranged matrix-like in array form. Each pixel includes at least one photoelectric conversion element.

The solid-state imaging device 23020 has the laminated structure of a first chip (upper chip) 910 and a second chip (lower chip) 920.

The laminated first and second chips 910, 920 may be electrically connected to each other through TC(S)Vs (Through Contact (Silicon) Vias) formed in the first chip 910.

The solid-state imaging device 23020 may be formed to have the laminated structure in such a manner that the first and second chips 910 and 920 are bonded together at wafer level and cut out by dicing.

In the laminated structure of the upper and lower two chips, the first chip 910 may be an analog chip (sensor chip) including at least one analog component of each pixel, e.g., the photoelectric conversion elements arranged in array form. For example, the first chip 910 may include only the photoelectric conversion elements.

Alternatively, the first chip 910 may include further elements of each photoreceptor circuit block. For example, the first chip 910 may include, in addition to the photoelectric conversion elements, at least some or all of the n-channel MOSFETs of the photoreceptor circuit blocks. Alternatively, the first chip 910 may include each element of the photoreceptor circuit blocks.

The first chip 910 may also include parts of the pixel back-ends 301. For example, the first chip 910 may include the memory capacitors, or, in addition to the memory capacitors, sample/hold circuits and/or buffer circuits electrically connected between the memory capacitors and the event-detecting comparator circuits. Alternatively, the first chip 910 may include the complete pixel back-ends. With reference to FIG. 1A, the first chip 910 may also include at least portions of the readout circuit 620, the threshold generation circuit 630 and/or the controller 650.

The second chip 920 may be mainly a logic chip (digital chip) that includes the elements complementing the circuits on the first chip 910 to the solid-state imaging device 23020. The second chip 920 may also include analog circuits, for example circuits that quantize analog signals transferred from the first chip 910 through the TCVs.

The second chip 920 may have one or more bonding pads BPD and the first chip 910 may have openings OPN for use in wire-bonding to the second chip 920.

The solid-state imaging device 23020 with the laminated structure of the two chips 910, 920 may have the following characteristic configuration:

The electrical connection between the first chip 910 and the second chip 920 is performed through, for example, the TCVs. The TCVs may be arranged at chip ends or between a pad region and a circuit region. The TCVs for transmitting control signals and supplying power may be mainly concentrated at, for example, the four corners of the solid-state imaging device 23020, by which a signal wiring area of the first chip 910 can be reduced.

FIGS. 15 and 16 show possible allocations of elements of the pixel 300 across the first chip 910 and the second chip 920 of FIG. 14.

The photoreceptor circuit PRC includes an amplifier portion and a feedback portion. The amplifier portion may include or consist of an inverting amplifier element, e.g. an n-channel MOSFET (metal oxide semiconductor field effect transistor). Alternatively, the amplifier portion may include an amplifier circuit with more than one transistor. In particular, the amplifier portion may be configured as common source amplifier circuit.

An output of the amplifier portion supplies the photoreceptor signal Vpr and feeds back to the input of the amplifier portion through the feedback portion. The feedback portion may include or consist of an amplifier element, e.g. an n-channel MOSFET in source-follower configuration. Alternatively, the feedback portion may include a p-channel MOSFET with fixed gate bias or a feedback circuit with more than one element.

The photoreceptor circuit PRC defines a predetermined current-to-voltage transfer characteristic. According to an example, the predetermined current-to-voltage transfer characteristic may be a logarithmic current-to-voltage transfer characteristic.

The feedback portion includes a controlled path, wherein a current through the controlled path is controlled in response to the feedback signal.

An input of the photoreceptor circuit PRC is electrically connected to the photoelectric conversion element PD. For example, the controlled path of the feedback portion and the photoelectric conversion element PD may be electrically connected in series.

In particular, the photoreceptor circuit PRC may include an n-channel feedback MOSFET 717. A source of the feedback MOSFET 717 is connected to a cathode of the photoelectric conversion element PD. An anode of photoelectric conversion element PD is electrically connected to a low supply voltage VSS. The photoreceptor circuit PRC further includes a common source amplifier including a n-channel amplifier MOSFET 715 and a load element. The source of the amplifier MOSFET 715 is electrically connected to the low supply potential VSS. The load element is electrically connected between the high supply potential VDD and the drain of the amplifier MOSFET 715. The load element may include the controlled path of a p-channel load MOSFET 716 with the gate electrically connected to a bias potential Vbias. The bias potential Vbias may be fixed.

In FIG. 15 the first chip 910 includes the photoelectric conversion element PD and the n-channel MOSFETs of the photoreceptor circuit block PR. The second chip 920 includes the p-channel load MOSFET 716 of the photoreceptor circuit block PR and the pixel back-ends 301. One through contact via 915 per pixel 300 passes the photoreceptor signal Vpr from the first chip 910 to the second chip 920.

Typically, the first chip 910 includes a p-type substrate and formation of p-channel MOSFETs may imply the formation of n-doped wells separating the p-type source and drain regions of the p-channel MOSFETs from each other and from further p-type regions. Avoiding the formation of p-channel MOSFETs may therefore simplify the manufacturing process of the first chip 910.

In FIG. 16 the first chip 910 includes the photoelectric conversion element PD. The second chip 920 includes the n-channel MOSFETs and the p-channel load MOSFET 716 of the photoreceptor circuit block PR and the pixel back-end 301. For each pixel 300, one single through contact via 915 passes the photocurrent Iphoto from the first chip 910 to the second chip 920. The total number of through contact vias 915 for the pixels is not greater than the number of pixels such that the first chip 910 is less complex.

FIG. 17 illustrates schematic configuration examples of solid-state imaging devices 23010, 23020.

The single-layer solid-state imaging device 23010 illustrated in part A of FIG. 17 includes a single die (semiconductor substrate) 23011. Mounted and/or formed on the single die 23011 are a pixel region 23012 (photoelectric conversion elements), a control circuit 23013 (readout circuit, threshold generation circuit, controller), and a logic circuit 23014 (pixel back-end). In the pixel region 23012, pixels are disposed in an array form. The control circuit 23013 performs various kinds of control including control of driving the pixels. The logic circuit 23014 performs signal processing.

Parts B and C of FIG. 17 illustrate schematic configuration examples of multi-layer solid-state imaging devices 23020 with laminated structure. As illustrated in parts B and C of FIG. 17, two dies (chips), namely a sensor die 23021 (first chip) and a logic die 23024 (second chip), are stacked in a solid-state imaging device 23020. These dies are electrically connected to form a single semiconductor chip.

With reference to part B of FIG. 17, the pixel region 23012 and the control circuit 23013 are formed or mounted on the sensor die 23021, and the logic circuit 23014 is formed or mounted on the logic die 23024. The logic circuit 23014 may include at least parts of the pixel back-ends 301 with the pixel circuits 300 as described with reference to the previous FIGS. The pixel region 23012 includes at least the photoelectric conversion elements.

With reference to part C of FIG. 17, the pixel region 23012 is formed or mounted on the sensor die 23021, whereas the control circuit 23013 and the logic circuit 23014 are formed or mounted on the logic die 23024.

According to another example (not illustrated), the pixel region 23012 and the logic circuit 23014, or the pixel region 23012 and parts of the logic circuit 23014 may be formed or mounted on the sensor die 23021, and the control circuit 23013 is formed or mounted on the logic die 23024.

FIG. 18 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 18, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 imaging an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 may be or may include a solid-state imaging device for event detection with pixel circuits according to the embodiments of the present disclosure. The imaging section 12031 may output the electric signal as event position information identifying pixels having detected an event. The light received by the imaging section 12031 may be visible light, or may be invisible light such as infrared rays or the like.

The in-vehicle information detecting unit 12040 detects information about the inside of the vehicle and may be or may include a solid-state imaging device for event detection and with pixel circuits according to the embodiments of the present disclosure. The in-vehicle information detecting unit 12040 is, for example, connected with a driver state detecting section 12041 that detects the state of a driver. The driver state detecting section 12041, for example, includes a camera that includes the solid-stage imaging device and that is focused on the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound or an image to an output device capable of visually or audible notifying information to an occupant of the vehicle or the outside of the vehicle. In the example of FIG. 18, an audio speaker 12061, a display section 12062, and an instrument panel 12063 are illustrated as the output device. The display section 12062 may, for example, include at least one of an on-board display or a head-up display.

FIG. 19 is a diagram depicting an example of the installation position of the imaging section 12031, wherein the imaging section 12031 may include imaging sections 12101, 12102, 12103, 12104, and 12105.

The imaging sections 12101, 12102, 12103, 12104, and 12105 are, for example, disposed at positions on a front nose, side-view mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the side view mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 19 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the side view mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The example of the vehicle control system to which the technology according to an embodiment of the present disclosure is applicable has been described above. By applying the pixel circuits according to the embodiments for obtaining event-triggered image information, also short events can be tracked. Temporal resolution is enhanced, less motion information is lost and the vehicle control system operates more reliable.

Additionally, embodiments of the present technology are not limited to the above-described embodiments, but various changes can be made within the scope of the present technology without departing from the gist of the present technology.

The solid-state imaging device according to the present disclosure may be any device used for analyzing and/or processing radiation such as visible light, infrared light, ultraviolet light, and X-rays. For example, the solid-state imaging device may be any electronic device in the field of traffic, the field of home appliances, the field of medical and healthcare, the field of security, the field of beauty, the field of sports, the field of agriculture, the field of image reproduction or the like.

Specifically, in the field of image reproduction, the solid-state imaging device may be a device for capturing an image to be provided for appreciation, such as a digital camera, a smart phone, or a mobile phone device having a camera function. In the field of traffic, for example, the solid-state imaging device may be integrated in an in-vehicle sensor that captures the front, rear, peripheries, an interior of the vehicle, etc. for safe driving such as automatic stop, recognition of a state of a driver, or the like, in a monitoring camera that monitors traveling vehicles and roads, or in a distance measuring sensor that measures a distance between vehicles or the like.

In the field of home appliances, the solid-state imaging device may be integrated in any type of sensor that can be used in devices provided for home appliances such as TV receivers, refrigerators, and air conditioners to capture gestures of users and perform device operations according to the gestures. Accordingly the solid-state imaging device may be integrated in home appliances such as TV receivers, refrigerators, and air conditioners and/or in devices controlling the home appliances. Furthermore, in the field of medical and healthcare, the solid-state imaging device may be integrated in any type of sensor, e.g. a solid-state image device, provided for use in medical and healthcare, such as an endoscope or a device that performs angiography by receiving infrared light.

In the field of security, the solid-state imaging device can be integrated in a device provided for use in security, such as a monitoring camera for crime prevention or a camera for person authentication use. Furthermore, in the field of beauty, the solid-state imaging device can be used in a device provided for use in beauty, such as a skin measuring instrument that captures skin or a microscope that captures a probe. In the field of sports, the solid-state imaging device can be integrated in a device provided for use in sports, such as an action camera or a wearable camera for sport use or the like. Furthermore, in the field of agriculture, the solid-state imaging device can be used in a device provided for use in agriculture, such as a camera for monitoring the condition of fields and crops.

Note that the present technology can also be configured as described below:

(1) A photoreceptor circuit block, including:

a pixel circuit that includes a photoreceptor circuit block configured to generate a photoreceptor signal;

an analog-to-digital converter stage including a first input and a second input, wherein the analog-to-digital converter stage is configured to compare a signal based on a first input signal applied to the first input with at least one first threshold voltage and to compare a signal based on a second input signal applied to the second input with at least one second threshold voltage; and an electronic switch assembly configured to pass the photoreceptor signal to the first input in a first operating state and to pass the photoreceptor signal to the second input in a second operating state.

(2) The pixel circuit according to (1), further including a first control circuit configured to control the electronic switch assembly based on at least one output signal of the analog-to-digital converter stage.

(3) The pixel circuit according to any of (1) to (2), wherein the analog-to-digital converter stage is configured to simultaneously compare the signal derived from the first input signal with an upper first threshold and with a lower first threshold.

(4) The pixel circuit according to any of (1) to (3), wherein the analog-to-digital converter stage includes a first converter stage configured to generate first event data based on the first input signal, and a second converter stage configured to generate second event data based on the second input signal.

(5) The pixel circuit according to (4), wherein the first converter stage includes a first converter circuit for generating the first event data based on the first input signal, and wherein the second converter stage includes a second converter circuit for generating the second event data based on the second input signal.

(6) The pixel circuit according to (4), wherein the analog-to-digital converter stage includes a shared converter circuit configured to sequentially generate the first event data based on the first input signal and the second event data based on the second input signal.

(7) The pixel circuit according to any of (1) to (6), wherein the analog-to-digital converter stage includes:

a first voltage memory circuit electrically connected to a first electronic switch of the electronic switch assembly and configured to generate a first differential voltage by subtracting a first memory voltage from the first input signal; and a second voltage memory circuit electrically connected to a second electronic switch of the electronic switch assembly and configured to generate a second differential voltage by subtracting a second memory voltage from the second input signal.

(8) The pixel circuit according to any of (1) to (7), further including:

a first memory capacitor and a first voltage memory reset circuit, wherein the first memory capacitor is electrically connected in series between the first electronic switch and the first memory reset circuit, and a second memory capacitor and a second voltage memory reset circuit, wherein the second memory capacitor is electrically connected in series between the second electronic switch and the second memory reset circuit.

(9) The pixel circuit according to (8), wherein each of the first and second memory reset circuits includes a voltage amplifier, a feedback capacitor and an switching element, wherein the memory reset circuit is configured such that in an off-state of the switching element the feedback capacitor is effective between input and output of the voltage amplifier and in an on-state of the switching element the feedback capacitor is short-circuited.

(10) The pixel circuit according to (9), further including:

an auxiliary control circuit configured to control the switching elements such that the first switching element switches to the off-state when the electronic switching assembly changes to the first operating state and switches to the on-state when the electronic switching assembly changes to the second operating state; and the second switching element switches to the off-state when the electronic switching assembly changes to the second operating state and switches to the on-state when the electronic switching assembly changes to the first operating state.

(11) The pixel circuit according to (10), wherein the auxiliary control circuit is configured to delay, by at least one gate propagation delay, trailing and falling edges of second control signals controlling the first and second switching elements with respect to corresponding edges of first control signals controlling the electronic switch assembly.

(12) The pixel circuit according to any of (1) to (11), further including:

a collision detection circuit configured to output a collision detection signal based on output signals of the analog-to-digital converter stage.

(13) The pixel circuit according to (12), further including:

a collision control circuit configured to control at least the electronic switch assembly based on the collision detection signal.

(14) A solid-state imaging device, including:

a pixel array including a plurality of pixel circuits, wherein photoelectric conversion elements of the pixel circuits are arranged in matrix form and wherein each pixel circuit includes:

a photoreceptor circuit block configured to generate a photoreceptor signal;

an analog-to-digital converter stage including a first input and a second input, wherein the analog-to-digital converter stage is configured to compare a signal based on a first input signal applied to the first input with at least one first threshold voltage and to compare a signal based on a second input signal applied to the second input with at least one second threshold voltage; and an electronic switch assembly configured to pass the photoreceptor signal to the first input in a first operating state and to pass the photoreceptor signal to the second input in a second operating state.

(15) The solid-state imaging device according to (14), further including:

a collision detection circuit configured to output a collision detection signal based on output signals of the analog-to-digital converter stage; and a controller configured to control the electronic switch assembly in response to a change of the collision detection signal.

The invention claimed is:

1. A pixel circuit, comprising:

a photoreceptor circuit block (PR) configured to generate a photoreceptor signal;

an analog-to-digital converter stage comprising a first input and a second input, wherein the analog-to-digital converter stage is configured to compare a signal based on a first input signal applied to the first input with at least one first threshold voltage and to compare a signal based on a second input signal applied to the second input with at least one second threshold voltage;

an electronic switch assembly configured to pass the photoreceptor signal to the first input in a first operating state and to pass the photoreceptor signal to the second input in a second operating state; and a first control circuit configured to control the electronic switch assembly based on at least one output signal of the analog-to-digital converter stage.

2. The pixel circuit according to claim 1, wherein the analog-to-digital converter stage is configured to simultaneously compare the signal derived from the first input signal with an upper first threshold and with a lower first threshold.

3. The pixel circuit according to claim 1, wherein the analog-to-digital converter stage comprises:

a first voltage memory circuit electrically connected to a first electronic switch of the electronic switch assembly and configured to generate a first differential voltage by subtracting a first memory voltage from the first input signal; and a second voltage memory circuit electrically connected to a second electronic switch of the electronic switch assembly and configured to generate a second differential voltage by subtracting a second memory voltage from the second input signal.

4. The pixel circuit according to claim 1, further comprising:

a first memory capacitor and a first memory reset circuit, wherein the first memory capacitor is electrically connected in series between the first electronic switch and the first memory reset circuit, and a second memory capacitor and a second memory reset circuit, wherein the second memory capacitor is electrically connected in series between the second electronic switch and the second memory reset circuit.

5. The pixel circuit according to claim 4, wherein each of the first memory reset circuit and the second memory reset circuit comprises a voltage amplifier, a feedback capacitor and a switching element, and is configured such that in an off-state of the switching element the feedback capacitor is effective between input and output of the voltage amplifier and in an on-state of the switching element the feedback capacitor is short-circuited.

6. The pixel circuit according to claim 5, further comprising:

an auxiliary control circuit configured to control the switching elements such that the first switching element switches to the off-state when the electronic switching assembly changes to the first operating state and switches to the on-state when the electronic switching assembly changes to the second operating state; and the second switching element switches to the off-state when the electronic switching assembly changes to the second operating state and switches to the on-state when the electronic switching assembly changes to the first operating state.

7. The pixel circuit according to claim 6, wherein the auxiliary control circuit is configured to delay, by at least one gate propagation delay, trailing and falling edges of second control signals controlling the first and second switching elements with respect to corresponding edges of first control signals controlling the electronic switch assembly.

8. The pixel circuit according to claim 1, further comprising:

a collision detection circuit configured to output a collision detection signal based on output signals of the analog-to-digital converter stage.

9. The pixel circuit according to claim 8, further comprising:

a collision control circuit configured to control at least the electronic switch assembly based on the collision detection signal.

10. A pixel circuit comprising:

a photoreceptor circuit block (PR) configured to generate a photoreceptor signal;

an electronic switch assembly configured to pass the photoreceptor signal to a first input in a first operating state and to pass the photoreceptor signal to a second input in a second operating state; and an analog-to-digital converter stage comprising the first input and the second input, wherein the analog-to-digital converter stage is configured to compare a signal based on a first input signal applied to the first input with at least one first threshold voltage and to compare a signal based on a second input signal applied to the second input with at least one second threshold voltage, and comprises a first converter stage configured to generate first event data based on the first input signal, and a second converter stage configured to generate second event data based on the second input signal.

11. The pixel circuit according to claim 10, wherein the first converter stage comprises a first converter circuit for generating the first event data based on the first input signal, and wherein the second converter stage comprises a second converter circuit for generating the second event data based on the second input signal.

12. The pixel circuit according to claim 10, wherein the analog-to-digital converter stage comprises a shared converter circuit configured to sequentially generate the first event data based on the first input signal and the second event data based on the second input signal.

13. A solid-state imaging device, comprising:

a pixel array comprising a plurality of pixel circuits, wherein photoelectric conversion elements (PD) of the pixel circuits are arranged in matrix form and wherein each pixel circuit comprises:

a photoreceptor circuit block (PR) configured to generate a photoreceptor signal;

an analog-to-digital converter stage comprising a first input and a second input, wherein the analog-to-digital converter stage is configured to compare a signal based on a first input signal applied to the first input with at least one first threshold voltage and to compare a signal based on a second input signal applied to the second input with at least one second threshold voltage;

and an electronic switch assembly configured to pass the photoreceptor signal to the first input in a first operating state and to pass the photoreceptor signal to the second input in a second operating state;

a collision detection circuit configured to output a collision detection signal based on output signals of the analog-to-digital converter stage;

and a controller configured to control the electronic switch assembly in response to a change of the collision detection signal.

\* \* \* \* \*